United States Patent
Maehara

(10) Patent No.: US 8,193,542 B2
(45) Date of Patent: Jun. 5, 2012

(54) PHOTOELECTRIC APPARATUS AND IMAGING APPARATUS INCLUDING THE SAME

(75) Inventor: Yoshiki Maehara, Kanagawa (JP)

(73) Assignee: Fujifilm Corporation (JP)

( * ) Notice: Subject to any disclaimer, the term of this patent is extended or adjusted under 35 U.S.C. 154(b) by 307 days.

(21) Appl. No.: 12/490,920

(22) Filed: Jun. 24, 2009

(65) Prior Publication Data

US 2009/0322923 A1    Dec. 31, 2009

(30) Foreign Application Priority Data

Jun. 27, 2008   (JP) .................. 2008-169181

(51) Int. Cl.
 *H01L 27/15* (2006.01)
 *H01L 29/20* (2006.01)
 *H01L 33/00* (2010.01)

(52) U.S. Cl. ............... 257/82; 257/88; 257/89

(58) Field of Classification Search .......... 257/82, 257/88, 89
See application file for complete search history.

(56) References Cited

U.S. PATENT DOCUMENTS

| | | | | |
|---|---|---|---|---|
| 4,868,664 A * | 9/1989 | Yaniv et al. | | 358/484 |
| 5,061,979 A * | 10/1991 | Kobayashi et al. | | 136/244 |
| 5,084,747 A * | 1/1992 | Miyawaki | | 257/432 |
| 6,300,612 B1 | 10/2001 | Yu | | |
| 6,881,945 B2 * | 4/2005 | Ishii et al. | | 250/208.1 |
| 2004/0014266 A1 * | 1/2004 | Uno et al. | | 438/200 |
| 2005/0040319 A1 * | 2/2005 | Ishii et al. | | 250/214.1 |
| 2006/0108658 A1 * | 5/2006 | Araki | | 257/444 |
| 2008/0217660 A1 * | 9/2008 | Aita et al. | | 257/225 |
| 2008/0265296 A1 * | 10/2008 | Uya | | 257/292 |
| 2010/0276670 A1 * | 11/2010 | Shen et al. | | 257/40 |

FOREIGN PATENT DOCUMENTS

| | | |
|---|---|---|
| JP | 2002-502120 A | 1/2002 |
| JP | 2005-311315 A | 11/2005 |

* cited by examiner

*Primary Examiner* — James Mitchell
(74) *Attorney, Agent, or Firm* — Studebaker & Brackett PC; Donald R. Studebaker

(57) ABSTRACT

A photoelectric apparatus includes a substrate and an array of a plurality of pixels each having at least one photoelectric device including a lower electrode over the substrate, a photoelectric layer over the lower electrode, and an upper electrode over the photoelectric layer, the photoelectric apparatus further includes an electrically conductive partition between adjacent two of the pixels, the conductive partition being electrically connected with the upper electrode and a transparent insulating layer on the upper electrode, and the pixels is individually sealed in by the partition and the transparent insulating layer.

13 Claims, 14 Drawing Sheets

PHOTOELECTRIC APPARATUS AND IMAGING APPARATUS INCLUDING THE SAME

CROSS-REFERENCE TO RELATED APPLICATIONS

This application claims the benefit of Japanese Patent Application JP 2008-169181, filed Jun. 27, 2008, the entire content of which is hereby incorporated by reference, the same as if set forth at length.

FIELD OF THE INVENTION

This invention relates to a photoelectric apparatus, a method of producing a photoelectric apparatus, and an imaging apparatus.

BACKGROUND OF THE INVENTION

Solid-state imaging apparatus are well known as image sensors used in digital still cameras and digital video cameras. A solid-state imaging apparatus (called a CCD sensor or a CMOS sensor) includes a substrate, e.g., a silicon semiconductor substrate and an array of pixels containing a photodiode and reads signal charge corresponding to photoelectrons generated in the photodiode of each pixel by a CCD or CMOS drive circuit.

The known solid state imaging apparatus includes not only the photodiode but a signal charge storage part, a charge transfer part, a signal readout part, a wire connecting them, and so on formed on the semiconductor substrate. Therefore, as the pixel pitch becomes smaller, the area proportion of the circuit region in unit pixel becomes larger, which of necessity leads to the problem of reduction in the effective area of the photodiode, i.e., reduction of pixel aperture ratio. Reduction of aperture ratio leads to reduction of sensitivity.

To compensate for the reduction of aperture ratio, it would be essential to condense incident light through, for example, a microlens formed on each pixel thereby to obtain a substantially increased aperture ratio. However, this solution unavoidably incurs an increase in cost due to involvement of an extra production step and complexity of optical design, and yet produces only a limited effect on sensitivity.

To overcome the problem, a stacked or tandem solid state imaging apparatus has been proposed, in which a photoelectric layer is superposed on a semiconductor substrate having circuitry and wiring formed to increase the pixel aperture ratio. A representative structure of such a configuration includes a semiconductor substrate and a large number of photoelectric devices arranged two-dimensionally in parallel to the substrate, the photoelectric devices each including a lower electrode formed on the substrate, a photoelectric layer stacked on the lower electrode, and an upper electrode stacked on the photoelectric layer. With a bias voltage applied between the lower and upper electrodes, charges photogenerated in the photoelectric layer are swept toward the upper and lower electrodes. The signals corresponding to the negative or positive charges collected at either electrode are read out by a CCD or CMOS circuit embedded in the semiconductor substrate. The photoelectric layer is a layer that absorbs a specific wavelength or wavelengths of incident light to generate charges (electrons and holes) in response to the quantity of light absorbed.

A photoelectric apparatus having a photoelectric layer containing an organic material excellent in color reproducibility has been studied for practical use. Examples of conventional sensors having a photoelectric layer containing an organic material include a full color image sensor having a thin organic semiconductor film between conductive electrodes as disclosed in JP 2002-502120A (corresponding to U.S. Pat. No. 6,300,612 B1) and a sensor having a light sensing portion containing an organic material between electrodes as disclosed in JP 2005-311315A.

SUMMARY OF THE INVENTION

A photoelectric apparatus used as a color image sensor includes a semiconductor substrate and a plurality of pixels each containing at least one photoelectric device, each pixel having a photoelectric layer detecting any one of red light (R), green light (G), and blue light (B). The plurality of pixels R, G, and B are two-dimensionally arrayed on the substrate in a specific color pattern.

In the fabrication of a photoelectric apparatus of the type described, the photoelectric layer is formed on the semiconductor substrate using microprocessing technology, such as photolithography, nanoimprinting, and thermolithography using a laser beam or an electron beam. There is a problem that the organic material contained in the photoelectric layer can deteriorate considerably in the atmosphere during or after the fabrication, which will result in reduction of device performance.

JP 2002-502120A (corresponding to U.S. Pat. No. 6,300,612 B1) supra teaches that patterning of RGB pixels is carried out by laser ablation or plasma etching. However, no measure is taken to prevent a thin film containing the organic material from being exposed to the atmospheric air, leaving the problem of reduction in device performance due to deterioration of the organic material in the air.

JP 2005-311315A supra has a plurality of light sensing portions separated from each other by a non-light-transmitting insulator but has no mention of protection of the organic material in the light sensing portions from deterioration.

An object of the invention is to provide a photoelectric apparatus having a photoelectric layer containing an organic material, the organic material being protected against deterioration thereby to prevent reduction of performance of the device; a method of fabricating the photoelectric apparatus; and an imaging apparatus.

The present invention provides in its first aspect a photoelectric apparatus. The photoelectric apparatus includes a substrate and an array of a plurality of pixels each having at least one photoelectric device. The photoelectric device includes a lower electrode over the substrate, a photoelectric layer over the lower electrode, and an upper electrode over the photoelectric layer. The photoelectric apparatus further includes an electrically conductive partition between any adjacent two of the pixels, the conductive partition being electrically connected with the upper electrode. The photoelectric apparatus further includes a transparent insulating layer on the upper electrode. The plurality of pixels are individually sealed in by the partition and the transparent insulating layer.

The invention provides the following preferred embodiments of the photoelectric apparatus.
(1) The photoelectric apparatus of the invention, in which the upper electrode has its upper surface positioned lower than the top surface of the partition.
(2) The photoelectric apparatus of the invention, in which the upper electrode is transparent.

(3) The photoelectric apparatus of the invention, in which the partition has the shape of a grid as seen from the light incident side, and every pixel is isolated from every other one by the partition.
(4) The photoelectric apparatus of the invention, in which the partition is composed of a lower part and an upper part continuous with the lower part. The upper part has a smaller size than the lower part such that it is set back from the lower part with respect to the individual pixels. The upper electrode is in contact with both the lower part and the upper part.
(5) The photoelectric apparatus of the invention, in which the partition is composed of a lower part and an upper part continuous with the lower part. The upper part has a larger size than the lower part such that it hangs over the lower part toward the individual pixels. The upper electrode is in contact with both the lower part and the upper part.
(6) The photoelectric apparatus of the invention, further including an insulating layer separating the lower electrodes of adjacent pixels from each other, and the partition is on the insulating layer.
(7) The photoelectric apparatus of the invention, in which the upper electrode, the photoelectric layer, and the lower electrode of each pixel are equal in area as seen from the light incident side and are stacked in aligned relation.
(8) The photoelectric apparatus of the invention, in which the photoelectric device is configured to collect electrons generated in the photoelectric layer in the lower electrode, the photoelectric layer is in contact with the partition, and the partition has a larger work function than the upper electrode.
(9) The photoelectric apparatus of the invention, in which the photoelectric device is configured to collect holes generated in the photoelectric layer in the lower electrode, the photoelectric layer is in contact with the partition, and the partition has a smaller work function than the upper electrode.
(10) The photoelectric apparatus of the invention, in which the plurality of pixels comprise a first pixel having a photoelectric device that converts electromagnetic radiation of a first wavelength range to electricity and a second pixel having a photoelectric device that converts electromagnetic radiation of a second wavelength range to electricity.
(11) The photoelectric apparatus of the invention, in which the plurality of pixels comprise a red pixel having a photoelectric device that converts red light to electricity, a green pixel having a photoelectric device that coverts green light to electricity, and a blue pixel having a photoelectric device that converts blue light to electricity.
(12) The photoelectric apparatus of the invention, in which each pixel has a photoelectric device converting electromagnetic radiation of a first wavelength range to electricity and a photoelectric device converting electromagnetic radiation of a second wavelength range to electricity.
(13) The photoelectric apparatus of the invention, in which each pixel has a photoelectric device converting red light to electricity, a photoelectric device converting green light to electricity, and a photoelectric device converting blue light to electricity.

The invention also provides in its second aspect an imaging apparatus having any of the photoelectric apparatus described above. The imaging apparatus has a drive circuit embedded in the substrate. The drive circuit is connected to the lower electrode and is configured to output a signal in response to charge.

In a preferred embodiment of the imaging apparatus of the invention, the drive circuit is a CCD drive circuit or a CMOS drive circuit.

The invention also provides in its third aspect the following methods of fabricating a photoelectric apparatus including a substrate and a plurality of pixels arrayed on the substrate, the pixels each having at least one photoelectric device containing a lower electrode over the substrate, a photoelectric layer over the lower electrode, and an upper electrode over the photoelectric layer.

A first method includes the steps of (a) forming a layer of an electrically conductive material on the lower electrode, (b) making an opening through the conductive material layer in a portion where each of the pixels is to be formed thereby to form a partition between adjacent pixels, (c) forming the photoelectric layer after the step (b), (d) forming the upper electrode after the step (c), (e) forming a transparent insulating layer after the step (d), and (f) removing the photoelectric layer, the upper electrode, and the transparent insulating layer from other than the portion of the opening.

A second method includes the steps of (a) forming a first layer of an electrically conductive material on the lower electrode, (b) making a first opening through the first conductive material layer in a portion where each of the pixels is to be formed thereby to form a partition between adjacent pixels, (c) forming the photoelectric layer after the step (b), (d) forming the upper electrode after the step (c), (e) forming a second layer of the electrically conductive material on the upper electrode after the step of (d), (f) removing the photoelectric layer, the upper electrode, and the second conductive material layer from above the first conductive material layer, (g) making a second opening through the second conductive material layer, the second opening having a smaller area than the first opening, and (h) forming a transparent insulating layer.

A third methods includes the steps of (a) forming a layer of an insulating material, (b) forming a layer of an electrically conductive material on the insulating material layer, (c) making an opening through the insulating material layer and the conductive material layer in a portion where each of the pixels is to be formed, (d) forming the lower electrode, (e) forming the photoelectric layer, (f) forming the upper electrode after the step (e), (g) forming a transparent insulating layer after the step (f), and (h) removing the lower electrode, the photoelectric layer, the upper electrode, and the transparent insulating layer from other than the portion of the opening.

A fourth method includes the steps of (a) forming a layer of an insulating material on the substrate, (b) forming a first opening and a second opening through the insulating material layer, the first opening being for forming a connector connecting to the lower electrode, the second opening being continuous with the first opening and having a larger area than the first opening, (c) forming a layer of an electrically conductive material, (d) making an opening through the conductive material layer in a portion where each pixel is to be fabricated, (e) forming the lower electrode, (f) forming the photoelectric layer, (g) forming the upper electrode after the step (f), (h) forming a transparent insulating layer after the step (g), and (i) removing the lower electrode, the photoelectric layer, the upper electrode, and the transparent insulating layer from other than the portion of the opening.

A fifth method includes the steps of (a) forming a layer of an insulating material, (b) making a first opening through the insulating material layer in a portion where each pixel is to be fabricated thereby to form a partition between adjacent pixels, (c) forming the lower electrode, (d) forming the photoelectric layer, (e) forming the upper electrode after the step (d), (f) forming a first layer of an electrically conductive material after the step (e), (g) removing the lower electrode, the photoelectric layer, the upper electrode, and the first conductive material layer from other than the portion of the first opening, (h) forming a second layer of the electrically conductive material on the top of the conductive material layer of every pixel and on the top of the insulating material layer, (i) making a second opening having a smaller area than the first opening through the first and the second conductive material layers formed in the steps (f) and (h), and (j) forming a transparent insulating layer.

The invention provides a photoelectric apparatus having a photoelectric layer containing an organic material, in which the photoelectric layer is protected against deterioration thereby to prevent deterioration of photoelectric performance; a method of fabricating such a photoelectric apparatus; and an imaging apparatus.

DETAILED DESCRIPTION OF THE INVENTION

Figure 1:
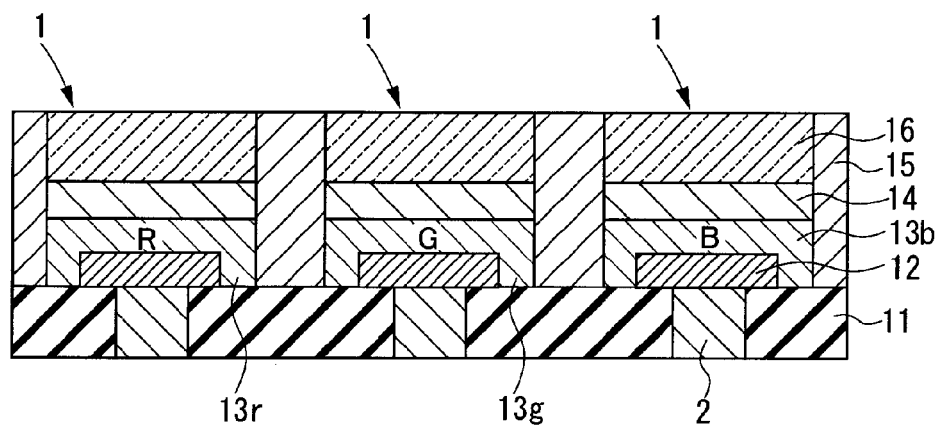
FIG. 1 is a schematic cross-section of a part of a photoelectric device incorporating a first embodiment of the invention.

The photoelectric device according to the present invention includes a substrate and a plurality of pixels arrayed on the substrate. Each pixel has at least one photoelectric device including a lower electrode that is formed over the substrate, an intermediate layer including a photoelectric layer formed over the lower electrode, and an upper electrode formed over the photoelectric layer. The photoelectric apparatus is useful as an image sensor having the pixels arrayed two-dimensionally or a line sensor having the pixels arrayed one-dimensionally. In what follows, the photoelectric device of the invention will be described with particular reference to an image sensor having two-dimensionally arrayed pixels.

As used herein, the term "intermediate layer" means a stack or a mixture of electromagnetic radiation-absorbing part, a photoelectric layer, an electron transport part, a hole transport part, an electron blocking part, a hole blocking part, a crystallization preventing part, an electrode, an interlayer contact improving part, and so forth. The photoelectric layer contains an organic layer. The organic layer preferably contains an organic p type compound or an organic n type compound.

The organic p type semiconductor (compound) is a donating organic semiconductor (compound), i.e., an organic compound having electron donating character, which is mostly exemplified by a hole transporting organic material. In some detail, when two organic materials are used in contact with each other, the material having a smaller ionization potential is an electron donating compound. Any electron donating organic compound may be used, including triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (e.g., naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand. In addition, any organic compounds having a smaller ionization potential than an organic compound used as an n type, electron-accepting organic compound may be used as a donating organic semiconductor.

The organic n type semiconductor (compound) is an accepting organic semiconductor (compound), i.e., an organic compound having electron accepting character, which is mostly exemplified by an electron transporting organic compound. In some detail, when two organic compounds are used in contact with each other, the compound having larger electron affinity is an electron accepting compound. Any compound having electron accepting character may be used, including fused aromatic carbocyclic compounds (e.g., naphthalene derivatives, anthracene derivatives, phenanthrene derivatives, tetracene derivatives, pyrene derivatives, perylene derivatives, and fluoranthene derivatives), nitrogen-, oxygen- or sulfur-containing 5- to 7-membered heterocyclic compounds (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetraazaindene, oxadiazole, imidazopyridine, pyralidine, pyrrolopyridine, thiadiazolopyridine, dibenzazepin, and tribenzazepin), polyarylene compounds, fluorene compounds, cyclopentadiene compounds, silyl compounds, and complexes having a nitrogen-containing heterocyclic compound as a ligand. In addition, any organic compounds having larger electron affinity than an organic compound used as an electron-donating organic compound may be used as an accepting organic semiconductor.

Any p type or n type organic dyes are useful. Examples of preferred organic dyes include, but are not limited to, cyanine dyes, styryl dyes, hemicyanine dyes, merocyanine dyes (including zeromethine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, chroconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, porphyrin dyes, chlorophyll dyes, phthalocyanine dyes, metal complex dyes, and fused aromatic carbocyclic compound dyes (e.g., naphthalene derivatives, anthracene derivatives, phenanthrene derivatives, tetracene derivatives, pyrene derivatives, perylene derivatives, and fluoranthene derivatives).

The metal complex compound is a metal complex having a ligand containing at least one of nitrogen, oxygen, and sulfur atoms coordinated to a center metal atom thereof. Preferred examples of the center metal ion in the metal complex include, but are not limited to, a beryllium ion, a magnesium ion, an aluminum ion, a gallium ion, a zinc ion, an indium ion, and a tin ion, more preferably a beryllium ion, an aluminum ion, a gallium ion, and a zinc ion. Even more preferred are an aluminum ion and a zinc ion. The metal complex may have various known ligands, including those described in H. Yersin, *Photochemistry and Photophysics of Coordination Compounds*, Springer-Verlag (1987) and Akio Yamamoto, *Yuki Kinzoku Kagaku—Kiso to Ohyo*, Shokabo Publishing Co., Ltd. (1982).

The ligand is preferably a nitrogen-containing heterocyclic ligand preferably having 1 to 30 carbon atoms, more preferably 2 to 20 carbon atoms, even more preferably 3 to 15 carbon atoms. The ligand may be monodentate or polydentate, preferably bidentate. Examples of useful ligands include a pyridine ligand, a bipyridyl ligand, a quinolinol ligand, a hydroxyphenylazole ligand (e.g., hydroxyphenylbenzimidazole, hydroxyphenylbenzoxazole or hydroxyphenylimidazole), an alkoxy ligand (preferably having 1 to 30 carbon atoms, more preferably 1 to 20 carbon atoms, even more preferably 1 to 10 carbon atoms, e.g., methoxy, ethoxy, butoxy, or 2-ethylhexyloxy), an aryloxy ligand (preferably having 6 to 30 carbon atoms, more preferably 6 to 20 carbon atoms, even more preferably 6 to 12 carbon atoms, e.g., phenyloxy, 1-naphthyloxy, 2-naphthyloxy, 2,4,6-trimethylphenyloxy, or 4-biphenyloxy), a heteroaryloxy ligand (preferably having 1 to 30 carbon atoms, more preferably 1 to 20 carbon atoms, even more preferably 1 to 12 carbon atoms, e.g., pyridyloxy, pyrazyloxy, pyrimidyloxy or quinolyloxy), an alkylthio ligand (preferably having 1 to 30 carbon atoms, more preferably 1 to 20 carbon atoms, even more preferably 1 to 12 carbon atoms, e.g., methylthio or ethylthio), an arylthio ligand (preferably having 6 to 30 carbon atoms, more preferably 6 to 20 carbon atoms, even more preferably 6 to 12 carbon atoms, e.g., phenylthio), a heterocyclic thio ligand (preferably having 1 to 30 carbon atoms, more preferably 1 to 20 carbon atoms, even more preferably 1 to 12 carbon atoms, e.g., pyridylthio, 2-benzimidazolylthio, 2-benzoxazolylthio, or 2-benzothiazolylthio), and a siloxy ligand (preferably having 1 to 30 carbon atoms, more preferably 3 to 25 carbon atoms, even more preferably 6 to 20 carbon atoms, e.g., triphenylsiloxy, triethoxysiloxy or triisopropylsiloxy). Preferred of them are a nitrogen-containing heterocyclic ligand, an aryloxy ligand, a heterocyclic oxy ligand, and a siloxy ligand. Particularly preferred are a nitrogen-containing heterocyclic ligand, a heteroaryloxy ligand, and a siloxy ligand. More preferred are a nitrogen-containing heterocyclic ligand, an aryloxy ligand, and a siloxy ligand.

It is preferred that the photoelectric layer (photosensitive layer) between the lower and the upper electrodes have a p type semiconductor sublayer and an n type semiconductor sublayer at least one of which is an organic semiconductor sublayer and also have a bulk heterojunction structure as an intermediate sublayer between the p type and n type semiconductor sublayers. The provision of the bulk heterojunction structure in the organic photoelectric layer compensates for the short carrier diffusion length of the organic layer, thereby improving the photoelectric conversion efficiency. For the details of the bulk heterojunction structure, reference can be made to JP 2005-303266A.

It is also preferred that the photoelectric layer (photosensitive layer) have at least two repeats of pn junction layers (called a tandem structure) composed of alternating p type semiconductor sublayers and n type semiconductor sublayers between the lower and upper electrodes. It is more preferred that a thin conductor layer be interposed between the repeats of pn junction layers. The conductor is preferably silver or gold, more preferably silver. The number of the repeats of pn junction layers in the tandem structure is not limited. To enhance the photoelectric conversion efficiency, the number of the repeats of pn junction layers is preferably 2 to 50, more preferably from 2 to 30, even more preferably 2 to 10. For the details of the tandem structure, reference can be made to JP 2006-86493A.

The photoelectric layer which has a p type semiconductor sublayer and an n type semiconductor sublayer (preferably a mixed or dispersed semiconductor layer known as a bulk heterojunction structure) between the lower and upper electrodes preferably contains an orientation-controlled organic compound in at least one of the p type and n type semiconductors. More preferably, both the p type and the n type semiconductors contain the orientation-controlled organic compound or an organic compound capable of having controlled orientation.

The organic compound that can be used in the organic sublayer of the photoelectric layer is preferably a compound having a conjugated π-electron. It is desirable that the compound be oriented with the plane of the pi-electrons not perpendicular but as close to parallel as possible to the substrate (electrode substrate). The angle of the plane to the substrate is preferably 0° to 80°, more preferably 0° to 60°, even more preferably 0° to 40°, still more preferably 0° to 20°, yet more preferably 0° to 10°, and most preferably 0° (namely, parallel to the substrate). The layer of the organic compound with controlled orientation may be at least a part of the whole organic layer. It is preferable that the proportion of the part with controlled orientation in the whole organic layer amounts to 10% or more, still preferably 30% or more, still preferably 50% or more, even still preferably 70% or more, particularly preferably 90% or more, and most desirably 100%. By controlling the orientation of the organic compound in the organic photoelectric layer, the short carrier diffusion length of the organic layer can be compensated for, thereby improving the photoelectric conversion efficiency.

In the case where the organic compound has controlled orientation, it is preferred that the plane of the heterojunction (e.g., pn junction) not be parallel with the substrate (electrode substrate) but as close as possible to perpendicular to the substrate. The angle of the heterojunction plane to the substrate is preferably 10° to 90°, still preferably 30° to 90°, even still preferably 50° to 90°, yet still preferably 70° to 90°, particularly preferably 80° to 90°, and most preferably 90° (namely, perpendicular to the substrate). The layer of the organic compound with a so controlled heterojunction plane may be at least a part of the whole organic layer. It is preferable that the proportion of the part with a controlled heterojunction plane in the whole organic layer be 10% or more, still preferably 30% or more, still preferably 50% or more, even still preferably 70% or more, particularly preferably 90% or more, and most desirably 100%. With the heterojunction plane so controlled, the area of the heterojunction plane in the photoelectric layer increases, and the amount of carriers, including electrons, holes, and electron/hole pairs, generated at the interface (heterojunction) increases to improve the photoelectric conversion efficiency. Thus, the photoelectric layer containing the organic compound layer having both the controlled orientation of the π-electron plane and the controlled orientation of the heterojunction plane exhibits particularly improved photoelectric conversion efficiency. These preferred embodiments are described in detail in JP 2006-86493A.

An organic dye layer with a greater thickness may be more desirable from the standpoint of light absorption. Considering a proportion of the thickness non-contributory to charge dissociation, the thickness of the organic dye layer is preferably 30 to 300 nm, more preferably 50 to 250 nm, even more preferably 80 to 200 nm.

Formation of Organic Layer:

The layer containing the organic compound is formed by dry or wet film formation. Examples of dry film formation techniques include physical vapor deposition (PVD) processes, such as vacuum evaporation, sputtering, ion plating, and molecular beam epitaxy, and chemical vapor deposition (CVD) processes, such as plasma-assisted polymerization. Wet film formation techniques include casting, spin coating, dipping, and LB method.

When a polymer is used as one or both of the p type and n type semiconductors (compounds), it is easier and therefore preferred to form the organic layer by a wet film formation process. If a polymer is deposited by a dry film formation process such as vacuum evaporation, the polymer can decompose. An oligomer can be used in dry film formation in place of a polymer.

When in using a low molecular compound, a dry film formation technique, particularly vacuum evaporation is preferably used. Vacuum evaporation is basically controlled by parameters including evaporation source heating system (resistance heating evaporation, electron beam evaporation, etc.), shape of evaporant container (crucible, boat, etc.), degree of vacuum, evaporation temperature, substrate temperature, deposition rate, and so forth. It is preferred to rotate the substrate to achieve uniform deposition. A higher degree of vacuum is more preferred. Specifically, the degree of vacuum is preferably $10^{-2}$ Pa or less, more preferably $10^{-4}$ Pa or less, even more preferably $10^{-6}$ Pa or less. All the operations involved in evaporation deposition are preferably conducted in vacuo. Basically, the organic compound must be kept away from direct contact with outer oxygen and moisture. The conditions described above must be controlled strictly because they are influential on the crystalline or amorphous properties, density, denseness, and the like of the organic layer. It is preferred to control the deposition rate by PI or PID control using a film thickness sensor such as a crystal oscillator or an interferometer. In the case of simultaneously depositing two or more compounds, a co-deposition process or a flash deposition process are used preferably.

Electrodes:

The electrodes of the photoelectric device used in the invention will be described in more detail. The intermediate layer inclusive of the photoelectric layer is interposed between the lower electrode (pixel electrode layer) and the upper electrode (counter electrode layer) and can contain an interelectrode material and the like. As used herein, the term "pixel electrode layer" refers to an electrode layer provided over a substrate having a charge storage/transfer/reading part formed therein and is usually divided into sections corresponding to individual pixels. By this configuration, signal charge converted from light energy by the photoelectric layer can be read out for every pixel by the charge storage/transfer/signal reading circuit substrate to obtain an image. The term "counter electrode layer" as used herein denotes an electrode layer facing the pixel electrode with the photoelectric layer therebetween and functioning to emit signal charge of opposite polarity to that swept into the pixel electrode. Because signal charge sweeping does not need to be done separately among pixels, the counter electrode layer is usually a single, monolithic electrode common to all the pixel electrodes and is therefore called "a common electrode layer".

The material forming the transparent conductive layer constituting the photoelectric device is preferably chosen from those capable of being deposited by use of a plasma-free film deposition system, an EB deposition system, or a pulse laser deposition system. Examples of such materials include metals, alloys, metal oxides, metal nitrides, metal borides, organic conductive compounds, and mixtures thereof. Specific examples thereof include conductive metal oxides, such as tin oxide, zinc oxide, indium oxide, indium tin oxide (ITO), indium zinc oxide (IZO), indium tungsten oxide (IWO), and titanium oxide; metal nitrides, such as titanium nitride; metals, such as gold, platinum, silver, chromium, nickel, and aluminum; mixtures or laminates of the metal and the conductive metal oxide recited above; inorganic conductive substances, such as copper iodide and copper sulfide; organic conductive substances, such as polyaniline, polythiophene, and polypyrrole; and laminates of ITO with the material recited above. Also useful are materials described in Japan Society for the Promotion of Science, Committee 166 on Transparent Oxide Optical/Electronic Materials (ed.), *Tomei Dodenmaku no Gijutsu*, 2nd Ed., Ohmsha, Ltd. (2006) and Minami Tadatsugu (supervisor), *Tomei Dodenmaku no Shintenkai*, CMC Publishing Co., Ltd. (1999), Yutaka Sawada (supervisor), *Tomei Dodenmaku no Shintenkai III—ITO to sono Daitaizairyo Kaihatu no Genjyo*, CMC Publishing Co., Ltd. (2008).

Particularly preferred materials for the transparent conductive layer are ITO, IZO, tin oxide, antimony-doped tin oxide (ATO), fluorine-doped tin oxide (FTO), zinc oxide, antimony-doped zinc oxide (AZO), and gallium-doped zinc oxide (GZO). The light transmittance of the transparent conductive layer is preferably 60% or more, still preferably 80% or more, even still preferably 90% or more, yet still preferably 95% or more, at the maximum absorption wavelength of the photoelectric layer for which the transparent conductive layer serves. A preferred range of the surface resistivity of the transparent conductive layer depends on whether it is the lower electrode or the upper electrode and whether the charge storage/transfer/reading part has a CCD structure or a CMOS structure. For use as the upper electrode layer, the surface resistivity is preferably not more than 10 kΩ/sq (kΩ/□), still preferably 1 kΩ/sq or less, when the charge storage/transfer/reading part has a CMOS structure, or preferably not more than 1 kΩ/sq, still preferably 0.1 kΩ/sq or less, when the charge storage/transfer/reading part has a CCD structure. For use as the lower electrode, on the other hand, the surface resistivity is preferably not more than 1 MΩ/sq, still preferably 0.1 MΩ/sq or less.

During transparent conductive layer formation, the substrate temperature is preferably 500° C. or lower, still preferably 300° C. or lower, even still preferably 200° C. or lower, yet still preferably 150° C. or lower. A gas may be introduced during the deposition. Any gas may be employed, such as Ar, He, $O_2$, $N_2$, or a mixture thereof. In the case of using an oxide material as a film forming material, it is recommended to use $O_2$ because an oxygen deficiency can often occur.

To apply voltage to the photoelectric layer increases photoelectric efficiency. The voltage to be applied is not limited, but a necessary voltage depends on the thickness of the intermediate layer inclusive of the photoelectric layer. In other words, the photoelectric conversion efficiency increases with the electric field applied to the photoelectric layer, but with the applied voltage being equal, the electric field intensity increases as the intermediate layer thickness decreases. Accordingly, when the intermediate layer has a small thickness, the voltage to be applied may be relatively low. The electric field to be applied to the intermediate layer is preferably 10 $V·m^{-1}$ or more, more preferably $1\times10^3$ $V·m^{-1}$ or more, even more preferably $1\times10^5$ $V·m^{-1}$ or more, still more preferably $1\times10^6$ $V·m^{-1}$ or more, yet more preferably $1\times10^7$ $V·m^{-1}$ or more. While there is no particular upper limit, application of too high an electric field intensity can cause a dark current to flow. From this viewpoint, the electric field to be applied is preferably $1\times10^{12}$ $V·m^{-1}$ or less, more preferably $1\times10^9$ $V·m^{-1}$ or less.

Auxiliary Layer:

The photoelectric apparatus of the invention preferably has a UV absorbing layer and/or an IR absorbing layer on each pixel. The UV absorbing layer absorbs or reflects at least light having a wavelength of 400 nm or shorter. The UV absorbing layer preferably has an absorptance of 50% or higher in a wavelength region of 400 nm or shorter. The IR absorbing layer absorbs or reflects at least light having a wavelength of 700 nm or longer. The IR absorbing layer preferably has an absorptance of 50% or higher in a wavelength region of 700 nm or longer. The UV absorbing layer and the IR absorbing layer can be formed by known methods. In an example, a mordant layer made of a hydrophilic polymer, such as gelatin, casein, glue, or polyvinyl alcohol, is provided on the substrate, and a dye having a desired absorption wavelength is added to the mordant layer, or the mordant layer is dyed with the dye, to form a colored layer. In another example, a colored resin is used, which is obtained by dispersing a specific colorant in a transparent resin. For example, a colored resin layer made of a polyamino resin having a colorant dispersed therein may be used, as disclosed by JP 58-46325A, JP 60-78401A, JP 60-184202A, JP 60-184203A, JP 60-184204A, and JP 60-184205A. A coloring material comprising a photosensitive polyimide resin is also usable. The photosensitive aromatic polyimide resin disclosed in JP 7-113685B, which has a photosensitive group in its molecule and cures at or below 200° C., having dispersed therein a colorant is usable. A colored resin having dispersed therein the pigment disclosed in JP 7-69486B is also usable. A dielectric multiple layer is preferably used; for the dielectric multiple layer has sharp wavelength dependence of light transmission. A microlens array may be provided on the photoelectric apparatus to improve light collecting efficiency.

Drive Circuit:

With respect to the charge transfer/readout part composing the drive circuit, reference can be made, e.g., in JP 58-103166A, JP 58-103165A, JP 2003-332551A. The charge transfer/readout part may have an appropriate structure, such as a semiconductor substrate having an MOS transistor formed thereon for every unit pixel or a structure having a CCD as a sensor. Taking, for instance, an imaging apparatus having MOS transistors, charge is generated in the photoelectric layer by incident light having passed through the auxiliary layer, the transparent insulating layer, and the upper electrode. On applying a voltage between the lower and upper electrodes to produce an electric field, the charge (an electron or a positive hole) moves through the intermediate layer to the lower electrode in the electric field. The charge then reaches the charge storage part of the MOS transistor, where it is stored. The charge stored in the charge storage part migrates to the charge readout part by switching the MOS transistor and is outputted as an electrical signal. In that way, full color image signals are inputted to the imaging apparatus containing a signal processing part. The signal charge may be read after a predetermined amount of bias charge to a charge storage diode (refresh mode) to store a predetermined amount of charge (photoelectric conversion mode). The photoelectric device per se may serve as a charge storage diode, or a charge storage diode may be provided separately.

Signal reading can be done using a conventional color readout circuit. The signal charge generated by photoelectric conversion in the photoelectric device is stored in either the photoelectric device per se or a separately provided capacitor. The stored charge is read simultaneously with the selection of pixel address by the signal reading technology of an MOS imaging device using the X-Y address system (a so-called CMOS sensor). Alternatively, the address is selected on pixel-by-pixel basis in sequence using a multiplexer switch and a digital shift register, and the signals are read out onto a common output line as signal voltage (or charge). An image sensor having a two-dimensional array of X-Y addresses is known as a CMOS sensor. In this imaging system, a switch provided on a pixel at an intersection of the X and Y coordinates is connected to a vertical shift register, and upon turning on the switch with a voltage from the vertical scanning shift register, signals read out from pixels on the same row are read out onto the column output line. These signals are sequentially read from the output terminal through a switch driven by the horizontal scanning shift register.

The output signals may be read using a floating diffusion detector or a floating gate detector. The S/N may be improved by providing a signal amplification circuit on the pixel part or by using a correlated double sampling technique.

Signal processing includes gamma correction using an ADC circuit, digitization through an AD converter, luminance signal processing, and color signal processing. Examples of the color signal processing include white balance processing, color separation processing, and color matrix processing. For use in an NTSC system, the RGB signals are converted into YIQ signals.

The charge transfer/readout part should provide a charge mobility of at least 100 $cm^2/V·sec$. Charge mobility of this level is obtained by making a choice of material from among semiconductors belonging to the groups IV, III-V, or II-VI. In particular, it is preferable to use silicon semiconductors in view of advanced microfabrication technology therefor and low cost. Any of a number of charge transfer/readout systems proposed to date can be adopted. A CMOS type or CCD type system is particularly preferred. The CMOS type system is often preferred to the CCD type in terms of high-speed reading, pixel addition, partial reading, and power consumption.

Connection:

A connector connecting the lower or upper electrode of the photoelectric device and the driving circuit may be made of any metal. It is preferable to use a metal selected from Cu, Al, Ag, Au, Cr, and W. A connector should be provided between individual pixels and the respective drive circuits.

Fabrication Process:

The photoelectric apparatus according to the invention can be fabricated in accordance with what we call microfabrication processing employed in the fabrication of known semiconductors. The processing basically includes repetition of pattern exposure with the use of electromagnetic radiation (e.g., the i- or g-line of mercury, excimer laser beam, or X-rays) or electron beam, pattern formation by development and/or burning, provision of device-forming materials (e.g., by wet coating, vacuum evaporation, sputtering, or CVD), and removal of non-pattern portions (e.g., by thermal decomposition or dissolution).

Preferred embodiments of the photoelectric apparatus of the invention and methods for fabricating them will be described with reference to the accompanying drawings.

[I] First Embodiment

FIG. 1 is a schematic cross-section of a part of a photoelectric device incorporating a first embodiment of the invention. The photoelectric apparatus has a two-dimensional array of photoelectric devices 1. The photoelectric apparatus of the first embodiment has pixels each having one photoelectric device arrayed two-dimensionally in an imaging region formed on the surface of a semiconductor substrate. The photoelectric device 1 of each pixel absorbs only a limited wavelength range of incident light radiation and generates charge by photoelectric conversion. The photoelectric layer contains an organic material capable of photoelectric conversion. The present embodiment will be described with particular reference to a configuration having an array of pixels absorbing red light (R) to generate charge, pixels absorbing green light (G) to generate charge, and pixels absorbing blue light (B) to generate charge. FIG. 1 depicts an array of only three pixels, an R pixel, a G pixel, and a B pixel.

The photoelectric device 1 detecting red light includes an interlayer insulating layer 11 formed on a semiconductor substrate made of, e.g., Si, a lower electrode 12 formed on the interlayer insulating layer 11, a photoelectric layer 13r formed on the lower electrode 12, and an upper electrode 14 formed on the photoelectric layer 13r. The photoelectric device 1 detecting green light includes an interlayer insulating layer 11 formed on the substrate, a lower electrode 12 formed on the interlayer insulating layer 11, a photoelectric layer 13g formed on the lower electrode 12, and an upper electrode 14 formed on the photoelectric layer 13g. The photoelectric device 1 detecting blue light includes an interlayer insulating layer 11 formed on the substrate, a lower electrode 12 formed on the interlayer insulating layer 11, a photoelectric layer 13b formed on the lower electrode 12, and an upper electrode 14 formed on the photoelectric layer 13b. All the embodiments hereinafter described inclusive of the first embodiment will be illustrated with particular reference to a configuration in which the intermediate layer is composed solely of a photoelectric layer.

The interlayer insulating layer 11 has a via plug 2 in every pixel. The via plug 2 contacts the lower side of the lower electrode 12. The via plug 2 functions as a connector electrically connecting the respective lower electrode 2 with the respective in-substrate wiring (drive circuitry) (not shown) embedded in the semiconductor substrate. The drive circuitry includes a readout circuit (e.g., a CCD or CMOS readout circuit) that functions to output a signal corresponding to the charge readout from the electrode.

The photoelectric apparatus of the present embodiment has an electrically conductive partition 15 between adjacent pixels. The partition 15 is in contact with a side face (the face of an end in the horizontal direction) of the upper electrode 14 of every pixel. The top surface (the end face on the light incident side) of the partition 15 is positioned higher than the upper surface of the upper electrode 14 or farther from the interlayer insulating layer 11 than the upper surface of the upper electrode 14. In other words, the upper surface of the upper electrode 14 is closer to the semiconductor substrate than the top surface of the partition 15.

The upper electrode 14 of each pixel is covered with a transparent insulating layer 16, which is transparent to incident light. The transparent insulating layer 16 is partitioned by the partition 15 into sections corresponding to the individual pixels. Each of the photoelectric layers 13r, 13g, and 13b is sealed in by the partition 15 and the transparent insulating layer 16 provided on the upper electrode 14.

With a bias voltage applied between the upper electrode 14 and the lower electrode 12, on light entering the photoelectric layers 13r, 13g, and 13b from the side of the respective upper electrodes 14, charge (hole and electron) is generated therein. Holes are collected in one of the upper electrode 14 and the lower electrode 12, while electrons are collected in the other electrode. The charge collected in the lower electrode 12 of each pixel is sent through the via plug 2 to an in-substrate readout circuit, where it is read. Where the photoelectric apparatus is used as an image sensor, an image signal is produced in response to the charge read from the individual pixels.

Figure 2:
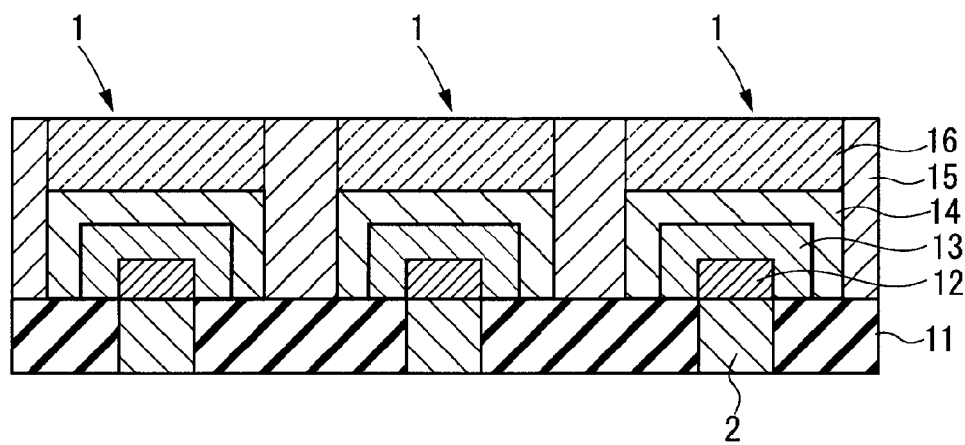
FIG. 2 shows a modification of the photoelectric apparatus of the first embodiment.

FIG. 2 illustrates a modification of the first embodiment. The difference from the photoelectric apparatus of FIG. 1 resides in that the photoelectric layer 13 (r, g, or b) is formed to surround the lower electrode 12 without contacting the partition 15, the upper and side surfaces of the photoelectric layer 13 are covered with the upper electrode 14, and the upper electrode is in contact with the partition 15. With an electric field applied between the upper electrode 14 and the lower electrode 12, the modified configuration makes more uniform electric field in the central portion and the peripheral portion of the photoelectric layer 13. This is effective in reducing an image lag when the photoelectric apparatus is used as an imaging apparatus, such as a digital still camera.

A method of fabricating the photoelectric apparatus of the first embodiment will be described by way of FIG. 3. FIGS. 3A through 3E represent schematic cross-sectional views in the steps of fabrication. The structure illustrated in FIG. 1 will be occasionally referred to.

Figure 3A:
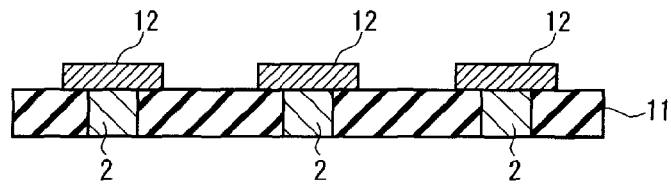
FIG. 3A, FIG. 3B, FIG. 3C, FIG. 3D, and FIG. 3E represent schematic cross-sections illustrating a method of fabricating the photoelectric apparatus of the first embodiment.

As shown in FIG. 3A, a lower electrode 12 for every pixel is formed on an interlayer insulating layer 11 at a position such that the lower electrode 12 is in contact with a via plug 2 formed through the interlayer insulating layer 11. The via plug 2 is electrically connected to an in-substrate trace formed in a semiconductor substrate. The in-substrate trace may be a CMOS type readout circuit formed embedded in a silicon substrate. The lower electrodes 12 can be formed by known semiconductor microfabrication techniques, such as photolithography, nanoimprinting, and thermolithography using a laser beam or an electron beam. The conductive material of the lower electrodes 12 is appropriately chosen according to the structure of the photoelectric device 1. For example, a pattern of lower electrodes 12 each having a 1.6 µm square shape is formed at a pixel pitch of 2.0 µm. The photoelectric device of the present embodiment may be a hole reading device in which holes dissociated from the photogenerated excitons are swept in the photoelectric layer to the lower electrode 12. In this case, ITO is used to form the lower electrodes 12. The ITO lower electrodes 12 may be formed with a thickness, e.g., of 50 nm by dry etching patterning using HI gas.

Figure 3B:
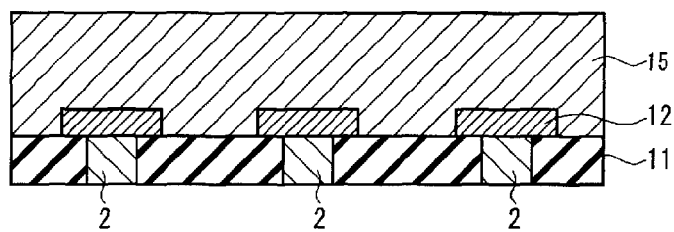

As illustrated in FIG. 3B, formation of the lower electrodes 12 is followed by formation of an electrically conductive material layer that will be patterned into a partition 15. The conductive material layer is formed to a thickness equal to the sum of the thickness of the photoelectric device 1 and the thickness of the transparent insulating layer 16 in FIG. 1. The conductive material is appropriately chosen according to the structure of the photoelectric device 1. In the case where the photoelectric devices are of hole reading type described supra, it is preferred that the conductive material forming the partition 15 have a smaller work function than the upper electrode 14 made of, for example, ITO having a work function of 4.5 eV. It is more preferred to use molybdenum (whose work function is nearly equal to that of ITO) or aluminum (whose work function is smaller than that of ITO) both easy to etch unidirectionally (by, e.g., reactive ion etching). It is particularly preferred to use n type polycrystalline silicon (hereinafter, "n$^+$ poly-Si") of which the work function (Fermi level) is easy to control by doping with impurity and which is suitable for unidirectional etching.

In using aluminum as a conductive material to make the partition 15, it is recommended to form an Al layer on TiN, followed by forming a TiN layer on the Al layer to improve the durability of the Al layer. A film formation technique is chosen as appropriate to the material. For example, an n$^+$ poly-Si layer is formed by depositing amorphous silicon to 1 µm by plasma enhanced CVD, converting the amorphous Si film to polycrystalline Si by irradiation with excimer laser light, and doping the polycrystalline Si with phosphorus.

In the case where the photoelectric device of the present embodiment is of an electron reading type, in which electrons dissociated from the photogenerated excitons are swept in the photoelectric layer to the lower electrode 12, it is preferred that the partition 15 have a larger work function than the upper electrode 14. Specifically, it is preferred to use a conductive material whose work function is larger than the ITO upper electrode 14 to make the partition 15. It is more preferred to use molybdenum whose work function is nearly equal to that of ITO and which is easy to etch unidirectionally (by, e.g., reactive ion etching). It is particularly preferred to use p type polycrystalline silicon (hereinafter, "p$^+$ poly-Si") of which the work function (Fermi level) is easy to control by doping with impurity and which is suitable for unidirectional etching.

Figure 3C:
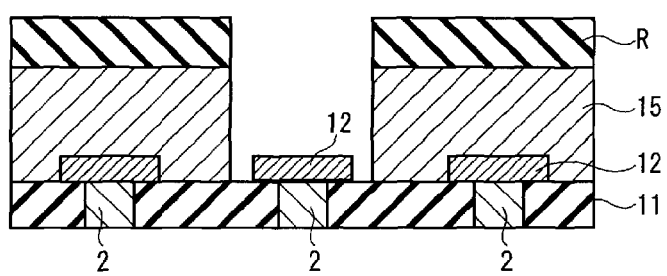

After formation of the conductive material layer as a precursor of the partition 15, a resist film R is provided thereon to mask other than the portion where a G pixel is to be fabricated, and the unmasked portion (where a G pixel is to be fabricated) of the conductive material layer is etched away to make an opening as illustrated in FIG. 3C. A known semiconductor microfabrication technique is used to make the opening. A resist material is chosen as appropriate to the microfabrication technique adopted. Etching of the conductive material is preferably carried out by a dry process enabling high-precision, unidirectional etching, such as reactive ion etching. Etching is continued until the surface of the previously formed lower electrode 12 is completely exposed. When, for example, n$^+$ poly-Si is used as a conductive material providing a partition 15, the unmasked portion is etched away by reactive ion etching using $Cl_2$ to make a 1.8 µm square opening in a portion where a G pixel is to be formed. Because the resist film R is utilized as a release layer in a later step of lift-off, the assembly as having the resist film R is subjected to the next step of forming a photoelectric layer containing an organic photoelectric material.

Figure 3D:
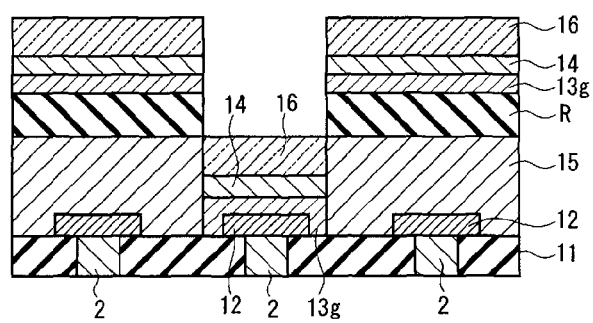

As illustrated in FIG. 3D, a photoelectric layer 13g, an upper electrode 14, and a transparent insulating layer 16 are built up in the opening in the order described. While the photoelectric layer 13g may be formed by any film formation process chosen as appropriate to the organic photoelectric material, it is preferred to use a technique enabling unidirectional film formation technique, such as unidirectional PVD (e.g., vacuum evaporation), so as to prevent the material of the photoelectric layer 13g from adhering to the inner wall of the opening and thereby to ensure intimate contact between the inner wall of the opening and the upper electrode 14 and the transparent insulating layer 16 both formed afterward. The intimate contact will ensure electrical connection between the upper electrode 14 and the partition 15 and ensure sealing by the transparent insulating layer 16 and the partition 15. For example, compound 1 shown below, quinacridone, and silicon oxide are successively deposited by vacuum evaporation under a pressure less than $1\times10^{-4}$ Pa to a deposit thickness of 150 nm, 100 nm, and 30 nm, respectively, to form a photoelectric layer 13g of an organic photoelectric device for light G.

Compound 1:

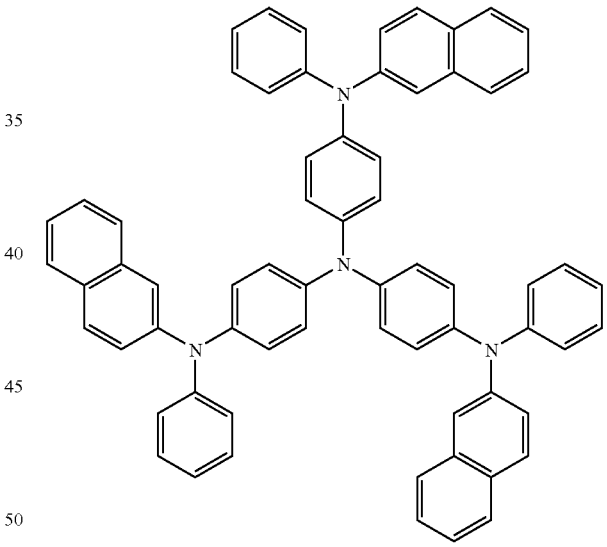

In the case of a photoelectric apparatus using a substrate having a drive circuit embedded therein (active matrix substrate), since the apparatus receives and/or emit light on and/or from the side of the upper electrode 14, the upper electrode 14 is fabricated of a transparent conductive material selected as appropriate according to the organic photoelectric device. While the upper electrode 14 may be formed by any film formation technique suited to the material, it is preferred to use an omni-directional deposition technique, such as omni-directional PVD (e.g., sputtering) or various CVD processes, to ensure electrical connection to the conductive material of the partition 15. For example, ITO is deposited to a thickness of 10 nm by facing targets sputtering in a vacuum chamber having a degree of vacuum of 1 Pa and having Ar gas introduced therein using ITO facing targets.

The transparent insulating layer 16 is preferably made of a material capable of sealing an organic light emitting diode (LED) or an organic photoelectric device which is fabricated by vacuum evaporation or a like technique and susceptible to considerable deterioration on being exposed to air. Examples of such a material are aluminum oxide, silicon oxide, silicon nitride, or silicon nitride-oxide. The transparent insulating layer 16 is preferably deposited by PVD (e.g., sputtering), plasma enhanced CVD, catalytic CVD, atomic layer deposition (ALD), and the like. For example, silicon nitride is deposited to a thickness of 0.6 μm by plasma enhanced CVD in a chamber having a degree of vacuum of 10 Pa and having $SiH_4$ and $N_2$ introduced therein.

The photoelectric layers 13r, 13g, 13b, the upper electrode 14, and the transparent insulating layer 16 are preferably formed continuously in vacuo and/or in an inert gas (e.g., Ar or $N_2$) without exposing the substrate to air between deposition operations so as to prevent a factor deteriorating the organic LED or organic photoelectric device from entering the film formation system. This can be achieved by using, for example, an organic LED fabrication system in which a vacuum evaporation unit for the formation of the photoelectric layer 13r, 13g, or 13b, a sputtering unit for the formation of the ITO upper electrode 14, and a plasma enhanced CVD unit for the formation of the transparent insulating layer 16 of silicon nitride are connected to a cluster vacuum transfer system having a pressure of $1 \times 10^{-4}$ Pa or less.

Figure 3E:
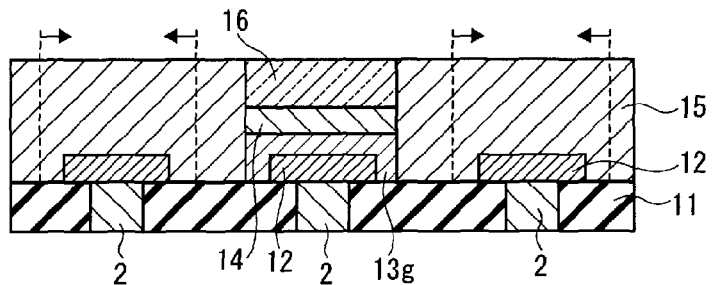

As illustrated in FIG. 3E, the photoelectric layer 13g, the upper electrode 14, and the transparent insulating layer 16 deposited on other than the G pixel portion are removed all at once by stripping off the resist film R that has been used to make an opening through the conductive material layer (lift-off step). To carry out lift-off, a suitable stripper may be used to remove the resist film R, or the resist film R may be decomposed by plasma etching.

A photoelectric device 1 having an R pixel and that having a B pixel are fabricated by repeating the steps of FIGS. 3C through 3E. For example, the portion of the conductive material layer corresponding to an R pixel defined by the dotted lines and the arrows in FIG. 3E is removed by etching to make an opening. Compound 1, squarylium, silicon oxide, ITO, silicon nitride are successively deposited in the opening to a thickness of 150 nm, 100 nm, 30 nm, 10 nm, and 0.6 μm, respectively, followed by lift-off. Then, the portion of the conductive material layer corresponding to a B pixel defined by the dotted lines and the arrows in FIG. 3E is removed by etching to make an opening. Compound 1, merocyanine, silicon oxide, ITO, silicon nitride are successively deposited in the opening to a thickness of 150 nm, 100 nm, 30 nm, 10 nm, and 0.6 μm, respectively, followed by lift-off. During the photolithographic operations including making an opening through the conductive material layer (which provides the partition 15) and lift-off, since each of the previously fabricated organic photoelectric devices containing an organic photoelectric material are in a sealed state by the interlayer insulating layer 11, the partition 15, and the transparent insulating layer 16, they are protected from exposure to air or a solvent and are therefore prevented from deterioration of device performance.

According to the above-described method of fabricating a photoelectric apparatus of the first embodiment, a photoelectric apparatus having a two-dimensional array of RGB pixels, which is used as a color image sensor, can be fabricated without causing deterioration of the RGB organic photoelectric devices during the fabrication steps utilizing semiconductor microfabrication technology, such as photolithography. The conventional patterning techniques, such as mask vapor deposition and inkjet printing, have encountered considerable difficulty in fabricating RGB pixels on a substrate at a pitch of less than 10 μm. In contrast, the present invention utilizes a photolithographic technique used to fabricate semiconductors as such and therefore achieves fabrication of a high resolution photoelectric apparatus having a pixel pitch of 2 μm or smaller while retaining a pixel aperture ratio of 60% or more. This suggests that future advancement in semiconductor microfabrication technology will be applied as such to the pixel fabrication in expectation for further reduction of pixel pitch and improvement of resolution.

The photoelectric apparatus of the first embodiment is freed from the problem of electrical cross talk by the existence of the partition 15, which will allow reduction in pixel pitch while bringing about further improvement in resolution.

In the case when metal is used as a conductive material to make the partition 15, the photoelectric apparatus reflects light incident on the partition 15. When polycrystalline silicon is used to make the partition 15, the light incident on the partition 15 can be reflected and absorbed. In either case, the problem of optical cross talk (color mixing) is eliminated. This will also allow reduction in pixel pitch while bringing about further improvement in resolution.

In the above-described embodiment of the photoelectric apparatus of the invention, a plurality of pixels comprise an R pixel containing a photoelectric device for photoelectric conversion of R light, a G pixel containing a photoelectric device for photoelectric conversion of G light, and a B pixel containing a photoelectric device for photoelectric conversion of B light. The structure of the photoelectric apparatus of the invention is not limited thereto. For instance, the plurality of pixels may comprise a first pixel having a photoelectric device that converts electromagnetic radiation of a first wavelength range to electricity and a second pixel having a photoelectric device that converts electromagnetic radiation of a second wavelength range to electricity. A so configured photoelectric apparatus may be designed to detect a plurality of infrared rays having different wavelengths in the respective pixels.

While, in the firth embodiment, each of the pixels has one photoelectric layer, the structure of the pixel is not limited thereto. For example, a pixel may have a photoelectric device converting electromagnetic radiation of a first wavelength range to electricity and a photoelectric device converting electromagnetic radiation of a second wavelength range to electricity. More specifically, a pixel may have a photoelectric device converting red light to electricity, a photoelectric device converting green light to electricity, and a photoelectric device converting blue light to electricity. A photoelectric apparatus so configured is able to detect light over different wavelength ranges through a single pixel.

Figure 4A:
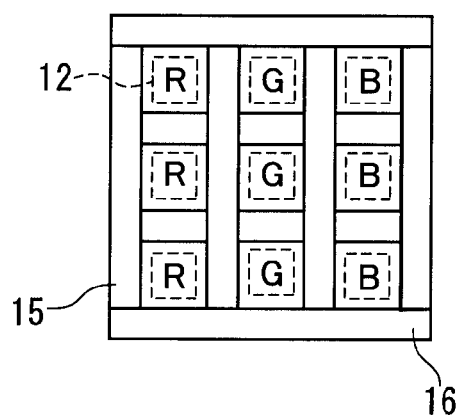
FIG. 4A and FIG. 4B are each a schematic plan of a representative configuration of a partition of a photoelectric apparatus.
Figure 4B:
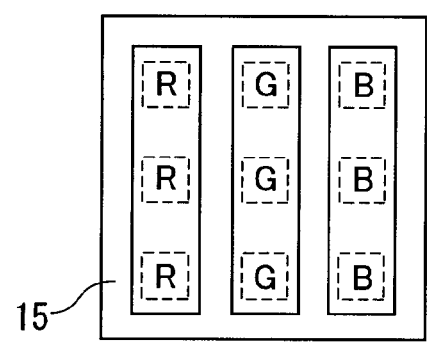

FIG. 4 are schematic plans of representative patterns of a partition of a photoelectric apparatus. FIGS. 4A and 4B each illustrate a part of a semiconductor substrate seen from the light incident side.

FIG. 4A represents an example in which pixel columns each having a plurality of pixels are separated from each other by the partition. In the example of FIG. 4A, three pixels of the same color make a column, and three columns of pixels of different colors are arrayed in stripe, being separated by the partition 15. The partition 15 is absent along both longitudinal ends of each pixel column (the upper and lower ends in FIG. 4A). Instead, the transparent insulating layer 16 is formed on the upper surface of every pixel column and along the upper and lower ends of the columns where the partition 15 is absent. The number of the pixels making a pixel column is not limited to 3 and may be decided appropriately.

FIG. 4B represents another example in which pixel columns each having a plurality of pixels are separated from each other by the partition. In the example of FIG. 4B, three pixels of the same color make a column, and three columns of pixels of different colors are arrayed in stripe, being separated by the partition 15. The partition 15 is also formed along both longitudinal ends of each pixel column, and the transparent insulating layer 16 is provided on the other portion where the partition 15 is absent, i.e., on the entire upper surface of every pixel column. The number of the pixels making a pixel column is not limited to 3 and may be decided appropriately.

Figure 5A:
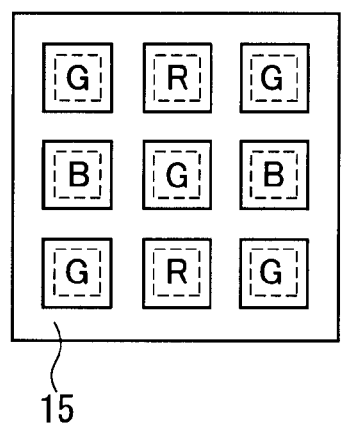
FIG. 5A and FIG. 5B are each a schematic plan showing a representative configuration of a partition and an array of pixels in a photoelectric apparatus.
Figure 5B:
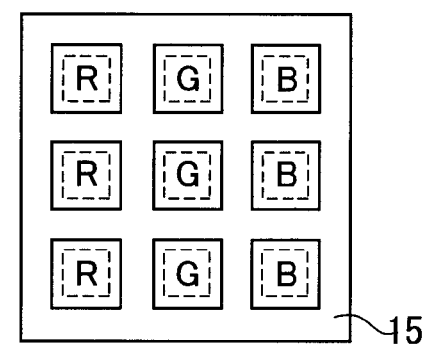

FIG. 5 are each a schematic plan showing a pattern of the partition and an array of pixels of the photoelectric apparatus. FIGS. 5A and 5B each illustrate a part of a semiconductor substrate seen from the light incident side.

As illustrated in FIGS. 5A and 5B, the partition 15 may be formed in a grid pattern as seen from the light incident side. In this case, every pixel is isolated from every other one by the partition 15. The array of FIG. 5A is a Bayer array, in which unit pixel arrays each including two G pixels, one B pixel, and one R pixel in a two by two configuration are arrayed two-dimensionally. FIG. 5B shows another array of pixels, in which pixels of the same color are arranged to make a column, and an R pixel column, a G pixel column, and a B pixel column are repeatedly arranged in that order in rows. Forming the partition 15 in such a grid pattern allows for arraying the pixels in any fashion, such as a Bayer array.

[II] Second Embodiment

Figure 6:
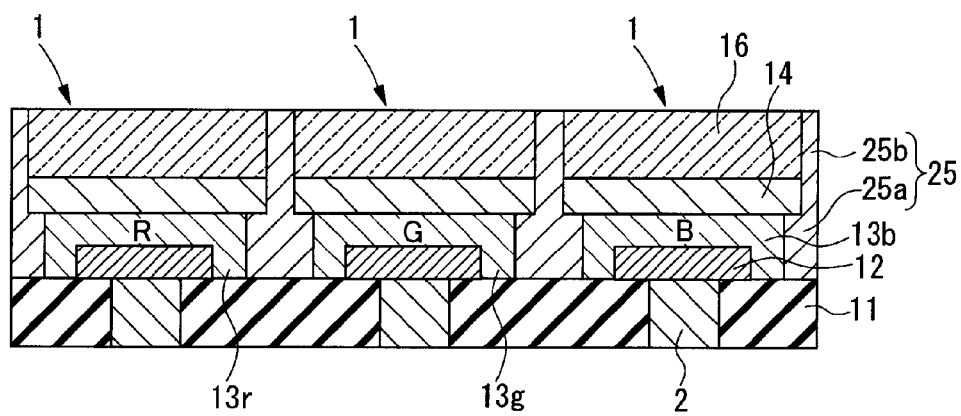
FIG. 6 is a schematic cross-section of a part of a photoelectric apparatus incorporating a second embodiment of the invention.

FIG. 6 is a schematic cross-section of a part of a photoelectric apparatus incorporating a second embodiment of the invention. In this and other embodiments, members or parts similar to those in the first embodiment in structure or action are identified by the same or equivalent reference numerals and will not be redundantly described.

In the photoelectric apparatus of the second embodiment, the partition 25 made of a conductive material is composed of a lower part 25a and an upper part 25b continuous with the lower part 25a. The lower part 25a is closer to the interlayer insulating layer 11, and an upper part 25b is farther from the interlayer insulating layer 11. The upper part 25b is different in thickness from the lower part 25a such that it is set back from the lower part 25a with respect to the individual pixels to provide a shoulder. More specifically, the upper part 25b has a smaller thickness than the lower part 25a in the horizontal direction of the cross-section of FIG. 6. The lower part 25a is in contact with the photoelectric layers 13r, 13g, or 13b. The shoulder defined by the upper and lower parts of the partition 25 is in contact with the lower side of the periphery of the upper electrode 14. The side face of the upper electrode 14 is in contact with the upper part 25b. This configuration provides an increased contact area between the partition 25 and the upper electrode 14 to further ensure the electrical connection therebetween.

According to the configuration of the second embodiment, since the contact area between the partition 25 and the upper electrode 14 increases compared with the configuration of the first embodiment, the electrical connection between them is ensured.

A method of fabricating the photoelectric apparatus of the second embodiment will be described. The structure illustrated in FIG. 6 will be occasionally referred to.

Lower electrodes 12 are formed on the interlayer insulating layer 11. The structure of the lower electrodes 12 and the process of forming them are the same as described with respect to the first embodiment.

A layer of a conductive material is then formed thereon as a precursor of the partition 25. The conductive material layer is composed of a lower sublayer and an upper sublayer as precursors of the lower part 25a and the upper part 25b, respectively. The upper and lower sublayers will be processed to provide the lower part 25b with a larger thickness and the upper part 25a with a smaller thickness in the horizontal direction to make a shoulder. The shoulder provides an increased contact area between the partition 25 and the upper electrode 14. The lower sublayer is deposited to such a thickness that the height of the lower part 25a, measured from the upper surface of the interlayer insulating layer 11, is substantially equal to the level of the upper surface of the photoelectric layers 13r, 13g, and 13b. The upper sublayer is deposited to a level substantially even with the top surface of the transparent insulating layer 16 of each photoelectric device 1. The material of the lower part 25a is chosen as appropriate to the structure of the photoelectric device to be formed. For example, in the case where the photoelectric device is of a hole reading type in which positive holes photogenerated in the photoelectric layer are collected in the lower electrode 12, and the upper electrode 14 is made of ITO having a work function of 4.5 eV, the lower part 25a is preferably made of a conductive material whose work function is equal to or smaller than that. When the lower part 25b and the upper part 25a are formed of different materials, a wider choice of materials is provided because the upper part 25b serves as an etching mask. While the material of the upper part 25b may be the same as the material of the lower part 25a, it is preferably different from the material of the lower part 25a in order to facilitate etching to form the upper part 25b with a smaller thickness than that of the lower part 25a. For example, Ti having a work function of 4.3 eV is deposited to form the lower sublayer (lower part 25a), and Al is then deposited thereon to form the upper sublayer (upper part 25b).

The thus formed conductive material layer is etched to make an opening in a portion where a pixel is to be fabricated. A known semiconductor microfabrication technique is utilized. A resist film is formed to mask other than the portion where a pixel is to be made. A resist material is chosen as appropriate to the microfabrication technique adopted. Etching of the conductive material layer is preferably carried out by a dry process enabling high-precision, unidirectional etching, such as reactive ion etching. In order to etch the upper sublayer in not only the portion unmasked by the resist film but in a portion masked by the resist film to provide the upper part 25b with a smaller thickness than the lower part 25a, it is preferred to choose a gas species for carrying out unidirectional etching and a gas species for carrying out omni-directional etching. Alternatively, the upper sublayer and the lower sublayer are etched with the same etchant gas, but the etching condition is varied so that the upper sublayer is etched at a higher rate than the lower sublayer. It is also possible that the upper and lower sublayers are successively etched unidirectionally (the etchant gas and the etching condition may be the same or varied), followed by omni-directionally etching only the upper sublayer to further reduce the thickness of the upper sublayer. Etching is continued until the surfaces of the previously formed lower electrode 12 is completely exposed. In an example, Ti is first deposited, and Al is then deposited thereon to form two conductive material sublayers. The upper Al sublayer is etched by reactive ion etching using $BCl_3.Cl_2.N_2$, and the lower Ti sublayer is then etched by reactive ion etching using $Cl_2.N_2$. Al is also etched during etching Ti. As a result, the thus formed upper part 25b of Al has a smaller thickness than the lower part 25a of Ti. The Ti sublayer is etched to make a 1.8 μm square opening in a portion where a pixel is to be fabricated. Because the resist film is utilized as a release layer in a later step of lift-off, the assembly as having the resist film is subjected to the next step of forming a photoelectric layer 13r, 13g, or 13b containing an organic photoelectric material.

After making the opening, a photoelectric layer 13r, 13g, or 13b, an upper electrode 14, a transparent insulating layer 16 are stacked in the opening in the same manner as for the photoelectric apparatus of the first embodiment to produce the photoelectric apparatus of the second embodiment.

According to the above-described method, a photoelectric apparatus can be fabricated without causing deterioration of the organic photoelectric devices during the fabrication steps utilizing semiconductor microfabrication technology. Furthermore, a photoelectric apparatus with a high resolution can be produced. Future advancement in semiconductor microfabrication technology will be applied as such to the pixel fabrication in expectation for further reduction of pixel pitch and improvement of resolution.

[III] Third Embodiment

Figure 7:
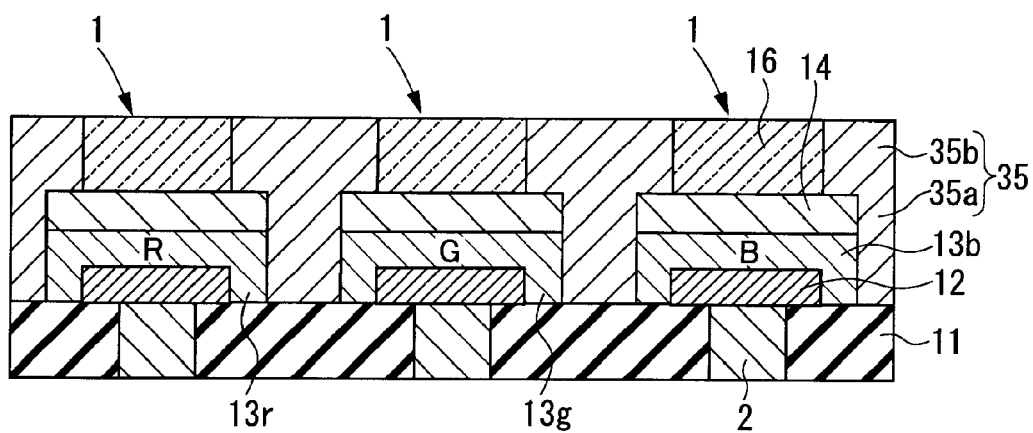
FIG. 7 is a schematic cross-section of a part of a photoelectric apparatus incorporating a third embodiment of the invention.

FIG. 7 is a schematic cross-section of a part of a photoelectric apparatus incorporating a third embodiment of the invention.

The photoelectric apparatus of the third embodiment has a partition 35 made of a conductive material. The partition 35 is composed of a lower part 35a and an upper part 35b continuous with the lower part 35a. The upper part 35b is different in thickness from the lower part 35a such that it hangs over the lower part 35a toward the individual pixels to make a downward facing shoulder, and the lower part 35a and the upper part 35b are both in contact with the upper electrode 14. More specifically, the upper part 35b has a larger thickness than the lower part 35a in the horizontal direction of the cross-section of FIG. 7. The lower part 35a is in contact with the side face of the upper electrode 14 and the photoelectric layer 13r, 13g, or 13b. The downward facing shoulder defined by the upper and lower parts of the partition 35 is in contact with the upper side of the periphery of the upper electrode 14. The side face of the upper electrode 14 is in contact with the lower part 35a.

As compared with the first embodiment, the configuration of the second embodiment provides an increased contact area between the partition 35 and the upper electrode 14 to further ensure the electrical connection therebetween.

A method of fabricating the photoelectric apparatus of the third embodiment will be described. FIGS. 8 and 9 represent schematic cross-sectional views in the steps of fabrication. The structure illustrated in FIG. 7 will be occasionally referred to.

Figure 8A:
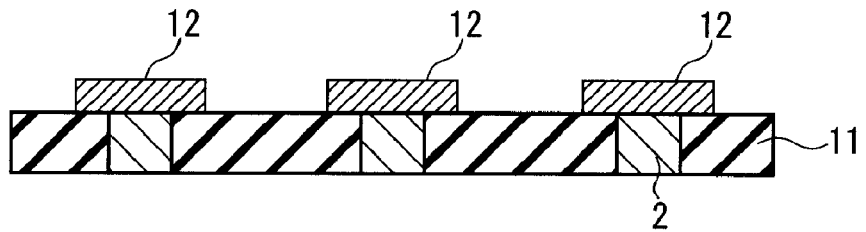
FIG. 8A, FIG. 8B, FIG. 8C, and FIG. 8D are schematic cross-sections illustrating a method for fabricating the photoelectric apparatus of the third embodiment.

As illustrated in FIG. 8A, lower electrodes 12 are formed on the interlayer insulating layer 11 having via plugs 2 previously formed therethrough. The structure of the lower electrodes 12 and the procedure of forming them are the same as described with respect to the first embodiment.

Figure 8B:
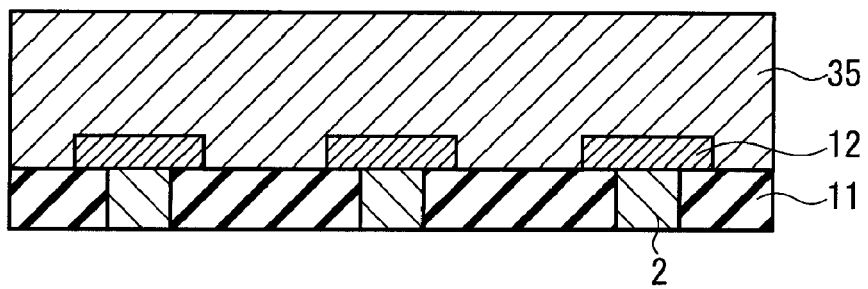
Figure 8C:
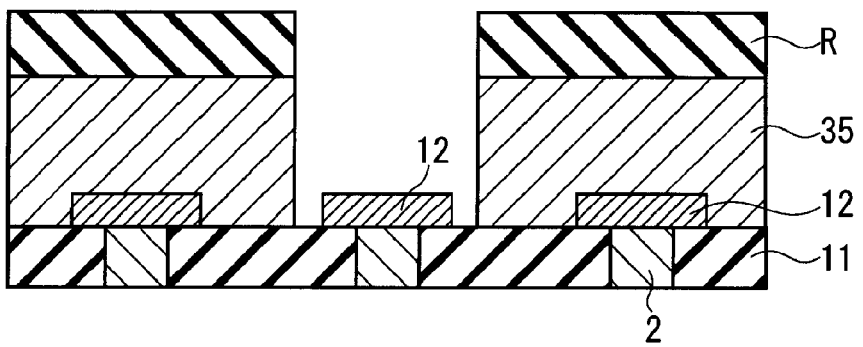

As illustrated in FIG. 8B, a first conductive material layer as a precursor of the partition 35 is formed on the interlayer insulating layer 11 and on the lower electrodes 12. As illustrated in FIG. 8C, a first opening is made through the first conductive material layer in a portion where a G pixel is to be fabricated. The structure of the first conductive material layer and the procedure of forming it are the same as in the first embodiment. The operation of making the first opening is the same as the operation of the making the opening in the first embodiment.

Figure 8D:
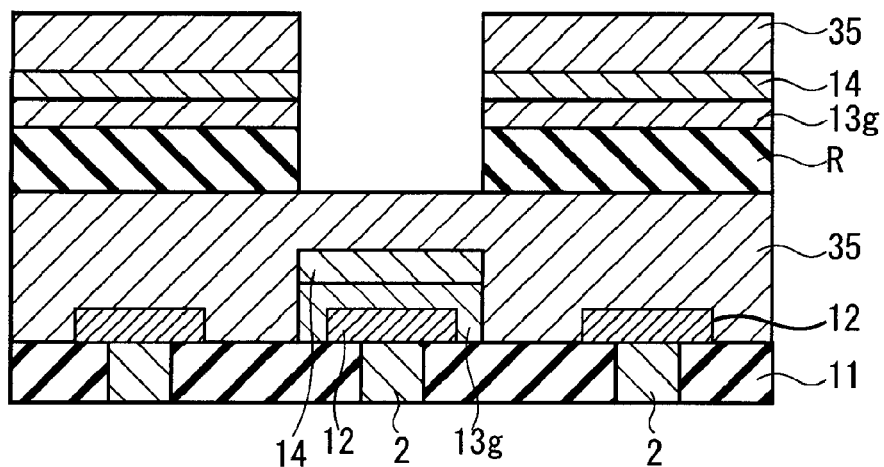

As shown in FIG. 8D, a photoelectric layer 13g and then an upper electrode 14 are deposited in the first opening corresponding to a G pixel as well as on the resist film R. The procedures of depositing the photoelectric layer 13g and the upper electrode 14 are the same as in the first embodiment.

A second conductive material layer is deposited on the upper electrode 14 in the opening (corresponding to a G pixel) as well as on the upper electrode 14 on the resist film R. The second conductive material layer should be a dense metal film capable of sealing an organic LED or an organic photoelectric device which are fabricated by vacuum evaporation deposition and are susceptible to considerable deterioration on being exposed to air. Besides, the second conductive material layer should be etchable under a condition that does not allow etching of the upper electrode 14 serving as an etching stopper. The second conductive material layer is preferably formed by depositing a metal easily etchable unidirectionally by, e.g., reactive ion etching, such as Al or Mo, by PVD or various CVD processes. For example, Mo is deposited to a thickness of 0.6 μm by CVD.

The photoelectric layers 13r, 13g, 13b, the upper electrode 14, and the second conductive material layer are preferably formed continuously in vacuo and/or in an inert gas (e.g., Ar or $N_2$) without exposing the substrate to air between deposition operations so as to prevent a factor deteriorating the organic LED or organic photoelectric device from entering the film formation system. This can be achieved by using, for example, an organic LED fabrication system in which a vacuum evaporation unit for the formation of the photoelectric layers 13r, 13g, and 13b, a sputtering unit for the formation of the ITO upper electrode 14, and a CVD unit for the formation of an Mo conductive layer are connected to a cluster vacuum transfer system having a pressure of $1 \times 10^{-4}$ Pa or less.

The photoelectric layer 13g, the upper electrode 14, and the second conductive material layer deposited on other than the G pixel portion, i.e., on the first conductive material layer are removed all at once by stripping off the resist film R that has been used to make the first opening through the first conductive material layer (lift-off step). To carry out lift-off, a suitable stripper may be used to remove the resist film R, or the resist film R may be decomposed by plasma etching.

Figure 9A:
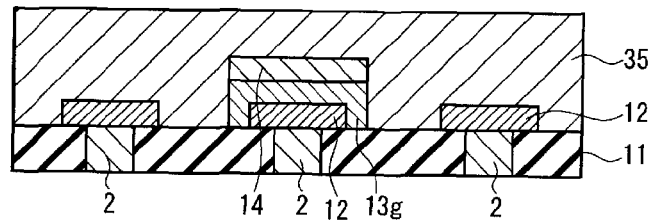
FIG. 9A, FIG. 9B, FIG. 9C, FIG. 9D, and FIG. 9E are schematic cross-sections illustrating the method for fabricating the photoelectric apparatus of the third embodiment.
Figure 9B:
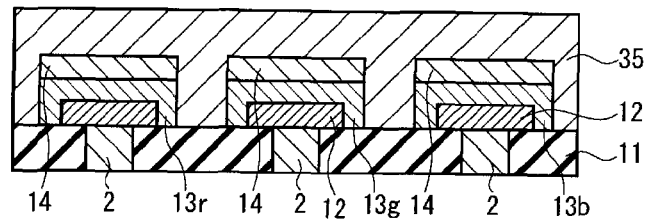

The steps of FIGS. 8B through 8D and FIG. 9A are repeated to produce R and B photoelectric devices 1 having an R pixel and a B pixel, respectively, as illustrated in FIG. 9B. During the photolithographic operations including making the first opening through the first conductive material layer (partition 35) and lift-off, since the previously fabricated organic photoelectric devices are each sealed by the interlayer insulating layer 11, the partition 35, and the conductive material layer 35, they are protected from exposure to air or a solvent and are therefore prevented from deterioration of performance.

Figure 9C:
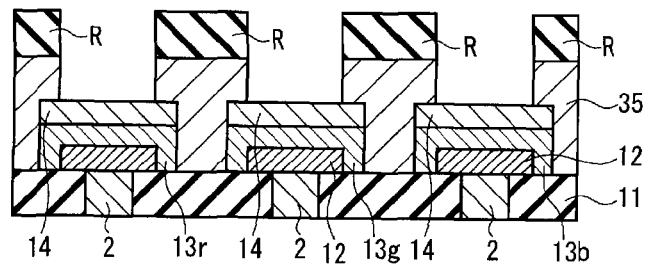

As illustrated in FIG. 9C, second openings are then made through the conductive material layer on the upper electrodes 14. The second openings have a smaller size in the horizontal direction than the first openings so that the upper part 35b of the thus formed partition 35, which is positioned on and above the upper electrode 14 has a larger thickness than the lower part 35a. Specifically, the second openings have a smaller area than the area of the first opening corresponding to each pixel formed in the step of FIG. 8C and are positioned so as to leave part of the conductive material on the periphery of the upper electrode 14 formed in the first opening of each pixel. As a result, the upper part 35b of the thus formed partition 35 hangs over the lower part 35a with a larger thickness than the lower part 35a in the horizontal direction. Such second openings are made as follows. After all the RGB pixels are fabricated, the second conductive material layer on the upper electrodes 14, which has served as a sealing layer in the pixel fabrication, is processed to make the second opening on every pixel by utilizing a known semiconductor microfabrication technique. A resist material is chosen as appropriate to the microfabrication technique adopted. Etching of the conductive material is preferably carried out by a dry process enabling high-precision, unidirectional etching, such as reactive ion etching. When the conductive material to be etched is Mo, for example, it is etched by reactive ion etching using $CF_4.O_2$. The etching completes when the upper surface of the ITO upper electrodes 14 is exposed. The Mo layer is etched to make 1.6 μm square openings (second openings) with their centers aligned with the centers of the corresponding first openings in a plan view. In this case, the upper part 35b on and above the upper electrodes 14 are 0.2 μm larger than the lower part 35a in the horizontal direction. There is thus provided an increased contact area between each ITO upper electrode 14 and the partition 35, which ensures an electrical connection between them. Because the resist film R is utilized as a release layer in a later step of lift-off, the assembly as having the resist film R is subjected to the next step of forming a transparent insulating layer 16.

Figure 9D:
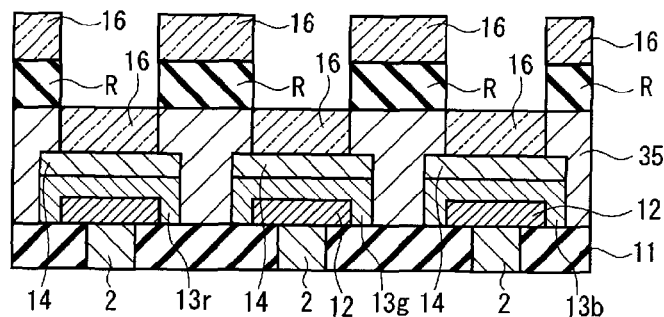
Figure 9E:
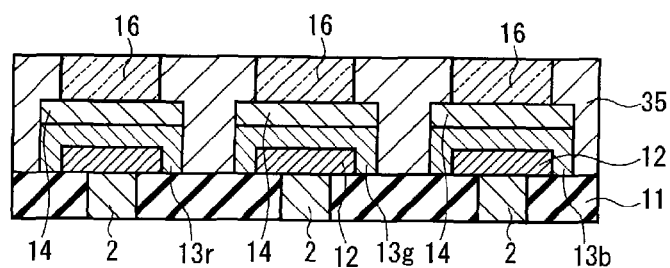

As illustrated in FIG. 9D, the step of making the second openings is followed by the step of forming a transparent insulating layer 16 to seal the photoelectric device of each pixel. The transparent insulating layer 16 is preferably formed by depositing a material capable of sealing an organic LED or an organic photoelectric device, such as aluminum oxide, silicon oxide, silicon nitride, or silicon nitride-oxide, by PVD (e.g., sputtering), plasma enhanced CVD, catalytic CVD, ALD, and the like. For example, silicon nitride is deposited to a thickness of 0.6 μm by plasma enhanced CVD. Finally, the resist film R is stripped off from the top of the partition 35 to lift off the resist film R together with the transparent insulating layer 16 deposited thereon. There is thus obtained the photoelectric apparatus of the third embodiment as shown in FIG. 9E.

According to the above described method of fabricating the photoelectric apparatus of the third embodiment, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution.

[IV] Fourth Embodiment

Figure 10:
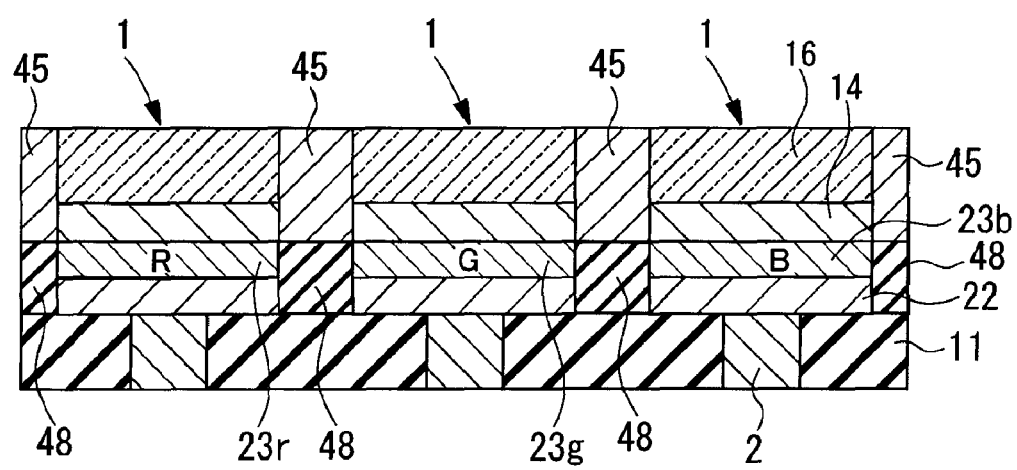
FIG. 10 is a schematic cross-section of a part of a photoelectric apparatus incorporating a fourth embodiment of the invention.

FIG. 10 is a schematic cross-section of a part of a photoelectric apparatus incorporating a fourth embodiment of the invention.

The photoelectric apparatus of the fourth embodiment has an insulating layer 48 made of an insulating material between the interlayer insulating layer 11 and the partition 45. The insulating layer 48 separates the adjacent lower electrodes 22. More specifically, the upper electrode 14 of each pixel is in contact on its side face with a partition 45 made of an electrically conductive material, and the photoelectric layer 23r, 23g, or 23b and the lower electrode 22 of each pixel are in contact on their side faces with the insulating layer 48. The transparent insulating layer 16 is formed on the upper electrode 14, and the partition 45 is formed with its top surface substantially even with the top surface of the transparent insulating layer 16. The upper electrode 14, the photoelectric layer 23r, 23g, or 23b, and the lower electrode 22 of each pixel are equal in area as seen from the light incident side (from the upper side in FIG. 10) and are stacked in aligned relation.

According to the configuration of the fourth embodiment, since the lower electrode 22, the photoelectric layer 23r, 23g, or 23b, and the upper electrode 14 have almost equal areas, an electric field is uniformly applied to the photoelectric layer 23r, 23g, or 23b. This is effective in reducing an image lag when the photoelectric apparatus is used as an imaging apparatus, such as a digital still camera. A uniform electric field in the photoelectric layer 23r, 23g, or 23b is also effective in eliminating a short circuit defect of the device. Furthermore, since the lower electrode 22, the photoelectric layer 23r, 23g, or 23b, and the upper electrode 14 have almost equal areas, the entire area of the opening in which each pixel is fabricated is the effective area of the photoelectric device, providing the maximum pixel aperture ratio. The insulating layer 48 serves to insulate the partition 45 and the lower electrode 22 of each photoelectric device without interrupting the electrical connection between the partition 45 and the upper electrode 14 of the device. Therefore, the thickness of the insulating layer 48 must be larger than that of the lower electrode 22 and smaller than the total thickness of the photoelectric device (i.e., the total thickness of lower electrode 22, the photoelectric layer 23r, 23g or 23b, and the upper electrode 14). It is preferred that the thickness of the insulating layer 48 be smaller than the total thickness of the lower electrode 22 and the photoelectric layer 23r, 23g, or 23b.

A method of fabricating the photoelectric apparatus of the fourth embodiment will be described. FIGS. 11A through 11D represent schematic cross-sectional views in the steps of fabrication. The structure illustrated in FIG. 10 will be occasionally referred to.

Figure 11A:
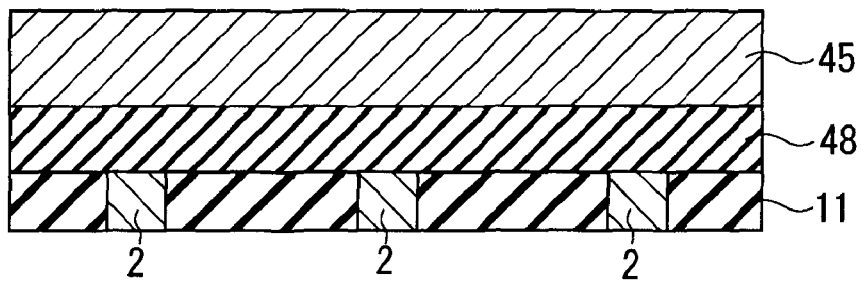
FIG. 11A, FIG. 11B, FIG. 11C, and FIG. 11D are schematic cross-sections illustrating a method for fabricating the photoelectric apparatus of the fourth embodiment.

As illustrated in FIG. 11A, an insulating material layer providing the insulating layer 48 and a conductive material layer providing the partition 45 are successively formed on the interlayer insulating layer 11 having via plugs 2 for individual pixels.

The material of the insulating layer 48 is required to function not only as an electrical insulator between the lower electrode 22 and the conductive material layer 45 but also as a protective film sealing the photoelectric device of every pixel. Similarly to the transparent insulating layer 16, the insulating layer 48 is preferably formed by depositing a material capable of protecting an organic LED or an organic photoelectric device, such as aluminum oxide, silicon oxide, silicon nitride, or silicon nitride-oxide, by PVD (e.g., sputtering), plasma enhanced CVD, catalytic CVD, ALD, and the like. For example, in the case where the interlayer insulating layer 11 on the substrate is made of silicon nitrile, the insulating layer 48 may be made of silicon oxide that is etchable under such a condition that does not cause silicon nitride to be etched during the subsequent step of making openings. Silicon oxide may be deposited to a thickness of 0.2 μm by CVD.

The conductive material providing the partition 45 may be chosen from those described with respect to the first embodiment. For example, n+ poly-Si may be deposited to a thickness of 0.8 μm.

Figure 11B:
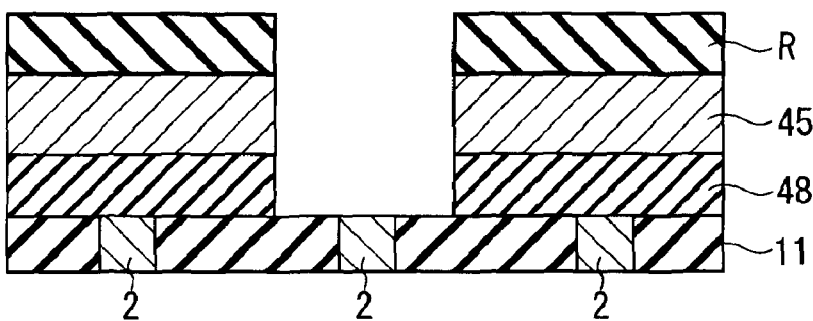

As illustrated in FIG. 11B, the conductive material layer providing the partition 45 and the insulating layer 48 are etched away from the portion where a G pixel is to be fabricated to make an opening. The above mentioned semiconductor microfabrication techniques can be utilized to make the opening. A resist material is chosen as appropriate to the microfabrication technique adopted. Etching of the conductive material layer and the insulating material layer is preferably carried out by a dry process enabling high-precision, unidirectional etching, such as reactive ion etching. When in using n+ poly-Si as a conductive material and silicon oxide as an insulating material as described, the unmasked portion of the two layers are etched away by reactive ion etching using $Cl_2$ and $CF_4.H_2$, respectively, to make, e.g., a 1.8 μm square opening. Because the resist film R is utilized as a release layer in a later step of lift-off, the assembly as having the resist film is subjected to the next step of forming a photoelectric layer containing an organic photoelectric material.

As illustrated in FIG. 1C, a lower electrode 22, a photoelectric layer 13g, an upper electrode 14, and a transparent insulating layer 16 are built up in the opening in the order described. The lower electrode 22 is preferably formed by unidirectional deposition, such as unidirectional PVD (e.g., vacuum evaporation or sputtering), to prevent the material of the lower electrode 22 from adhering to the inner wall of the opening so as not to cause a short circuit between the lower electrode 22 and the upper electrode 14. For example, ITO is deposited by sputtering to a thickness of 50 nm.

Figure 11C:
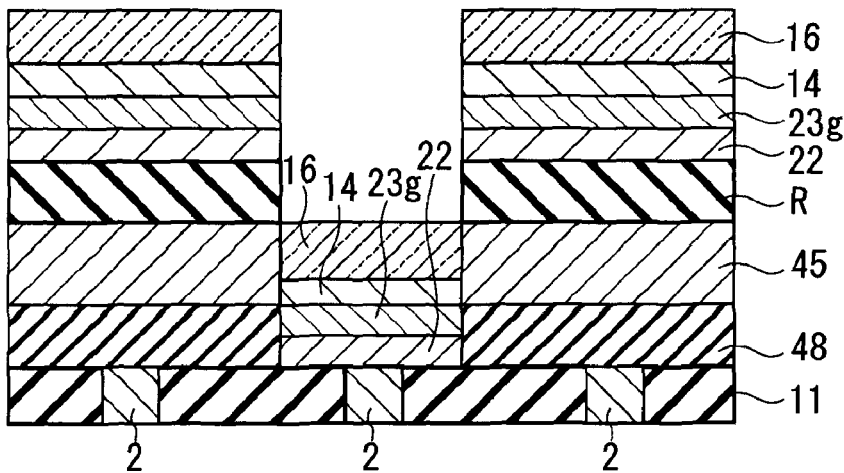
Figure 11D:
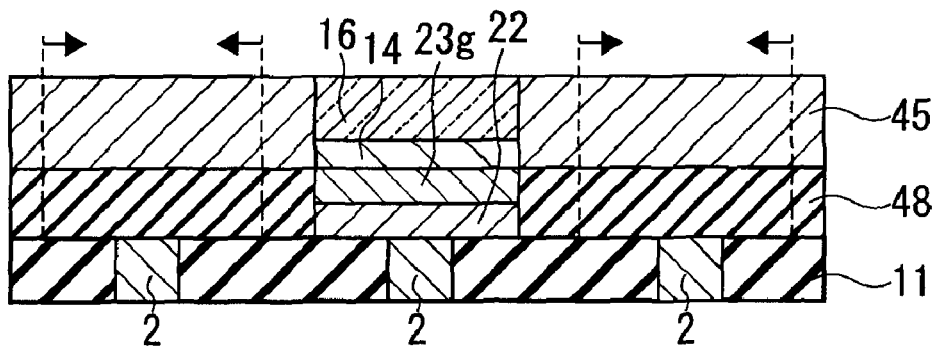

The lower electrode 22, the photoelectric layer 23g, the upper electrode 14, and the transparent insulating layer 16 deposited on other than the G pixel portion are removed all at once by stripping off the resist film R shown in FIG. 11C (lift-off step). To carry out lift-off, a suitable stripper may be used to remove the resist film R, or the resist film R may be decomposed by plasma etching. A photoelectric device 1 for an R pixel and that for a B pixel are fabricated in the portions defined by the dotted lines and the arrows in FIG. 11D by repeating the steps of FIGS. 11B to 11C.

According to the above described method of making the photoelectric device of the fourth embodiment, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution.

In addition, formation of the lower electrode 22 in the opening defined by the insulating layer 48 does not need a step of patterning the electrode layer on the interlayer insulating layer 11 as involved in the above embodiments. Therefore, the number of the fabrication steps is reduced.

Another method of fabricating the photoelectric apparatus of the fourth embodiment will be described. FIGS. 12A through 12E represent schematic cross-sectional views in the steps of fabrication. The structure illustrated in FIG. 10 will be occasionally referred to.

Figure 12A:
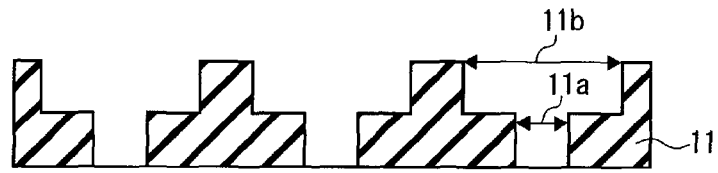
FIG. 12A, FIG. 12B, FIG. 12C, FIG. 12D, and FIG. 12E are schematic cross-sections illustrating another method for fabricating the photoelectric apparatus of the fourth embodiment.

An interlayer insulating layer 11 with a predetermined thickness is formed on a semiconductor substrate. As illustrated in FIG. 12A, the interlayer insulating layer 11 is patterned to make first openings 11a at positions corresponding to via plugs 2 leading to circuitry embedded in the substrate. A commonly used step of semiconductor fabrication can be utilized to make the first openings 11a. The resist film used is stripped off.

A resist pattern is formed to make second openings 11b through the interlayer insulating layer 11 in portions where RGB pixels are to be built up. A commonly used, semiconductor fabrication step may be utilized to carry out the patterning. For example, a resist film is patterned to make a 1.8 μm square opening in every portion where an R, G, or B pixel is to be fabricated.

The interlayer insulating layer 11 is again etched through the patterned resist film to make the second openings 11b as illustrated in FIG. 12A. This etching step is carried out such that the lower electrode 22 and the upper electrode 14 of a photoelectric device of a pixel that is to be fabricated in each second opening 11b will be electrically insulated from each other and that an electrical connection between the partition 45 formed later and the upper electrode 14 will not be interrupted. The depth of etching the interlayer insulating layer 11 this time must be larger than the thickness of the lower electrode 22 and be smaller than the total thickness of the photoelectric device (i.e., the total thickness of the lower electrode 22, the photoelectric layer 23g, and the upper electrode 14). It is preferred that the depth be smaller than the total thickness of the lower electrode 22 and the photoelectric layer 23g. The resist film is removed after etching the interlayer insulating layer 11. In this step of etching, a commonly employed, semiconductor fabrication step may be used as appropriate.

Figure 12B:
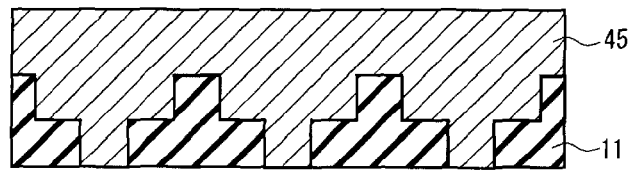

As illustrated in FIG. 12B, a layer of a conductive material is deposited on the interlayer insulating layer 11 to make via plugs 2. In order to completely fill the first openings 11a with the conductive material and to make use of the conductive material layer as a partition 45, the conductive material layer is preferably formed by depositing Mo or W whose work function is almost equal to that of ITO by CVD. For example, Mo is deposited to completely fill the first openings 11a and the second openings 11b, and the deposition is further continued until the thickness above the top of the interlayer insulating layer 11 reaches 0.6 μm. Prior to depositing Mo or W, TiN may be deposited on the interlayer insulating layer 11 by CVD so as to prevent reaction between Mo or W and the interlayer insulating layer 11, as is commonly practiced in the semiconductor manufacturing.

Figure 12C:
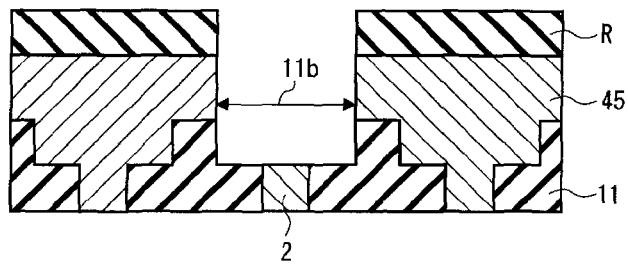

As shown in FIG. 12C, the conductive material layer is etched in a portion where a G pixel is to be fabricated to make an opening equivalent to the second openings 11b. The etching may be conducted using the above described semiconductor microfabrication technology. A resist material is chosen as appropriate to the microfabrication technique adopted. Etching of the conductive material layer is preferably carried out by a dry process enabling high-precision, unidirectional etching, such as reactive ion etching. The etching is performed until the bottom of the second opening 11b that have been formerly made through the interlayer insulating layer 11. Nevertheless, the etching may be stopped to leave the conductive material with a thickness, e.g., of 0.1 μm or less, on the bottom of the second opening 11b so as to provide an increased contact area between the via plug 2 and the lower electrode 12. When in using Mo as a conductive material as in the case described above, the unmasked portion of the conductive material layer is etched away by reactive ion etching using $CF_4.O_2$ to make a 1.8 μm square opening in a portion where each pixel is to be formed. Because the resist film R is utilized as a release layer in a later step of lift-off, the assembly as having the resist film R is subjected to the next step of forming a photoelectric layer 23g containing an organic photoelectric material.

After making the opening for a G pixel, a lower electrode 22, a photoelectric layer 23g, an upper electrode 14, and a transparent insulating layer 16 are built up in the opening in the order described. The lower electrode 22 is preferably formed by unidirectional deposition, such as unidirectional PVD (e.g., vacuum evaporation or sputtering), to prevent the material of the lower electrode 22 from adhering to the inner wall of the opening (i.e., the side of the partition 45) so as not to cause a short circuit between the lower electrode 22 and the upper electrode 14. For example, ITO is deposited by sputtering to a thickness of 50 nm.

Figure 12D:
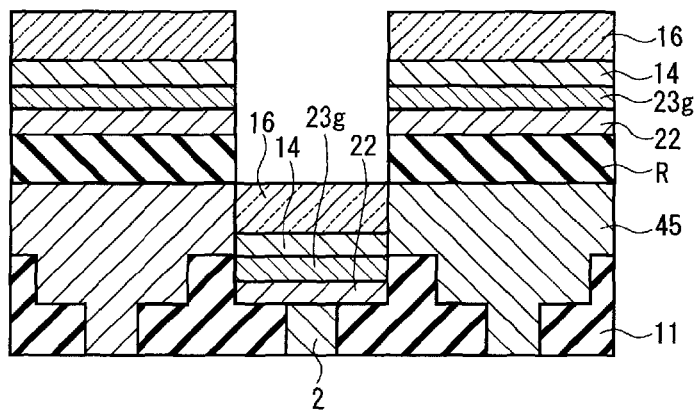
Figure 12E:
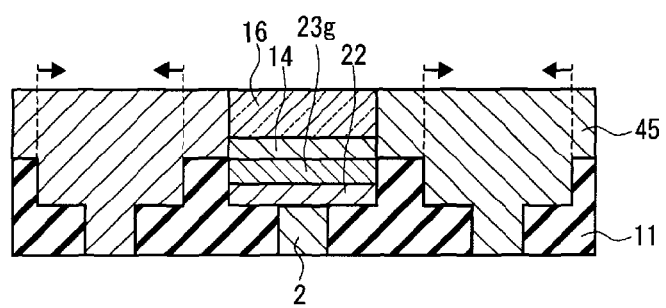

The lower electrode 22, the photoelectric layer 23g, the upper electrode 14, and the transparent insulating layer 16 deposited on other than the G pixel portion are removed all at once by stripping off the resist film R shown in FIG. 12D (lift-off step). To carry out lift-off, a suitable stripper may be used to remove the resist film R, or the resist film R may be decomposed by plasma etching. A photoelectric device 1 for an R pixel and that for a B pixel are fabricated in the portions defined by the dotted lines and the arrows in FIG. 12E by repeating the steps of FIGS. 12C to 12E.

According to the above described method of fabricating the photoelectric apparatus of the fourth embodiment, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution. Additionally, the method achieves a further reduction of the number of fabrication steps since the conductive material layer providing a via plug that connects the in-substrate drive circuit and the lower electrode of each pixel and the conductive material layer providing the partition 45 are formed simultaneously.

[V] Fifth Embodiment

Figure 13:
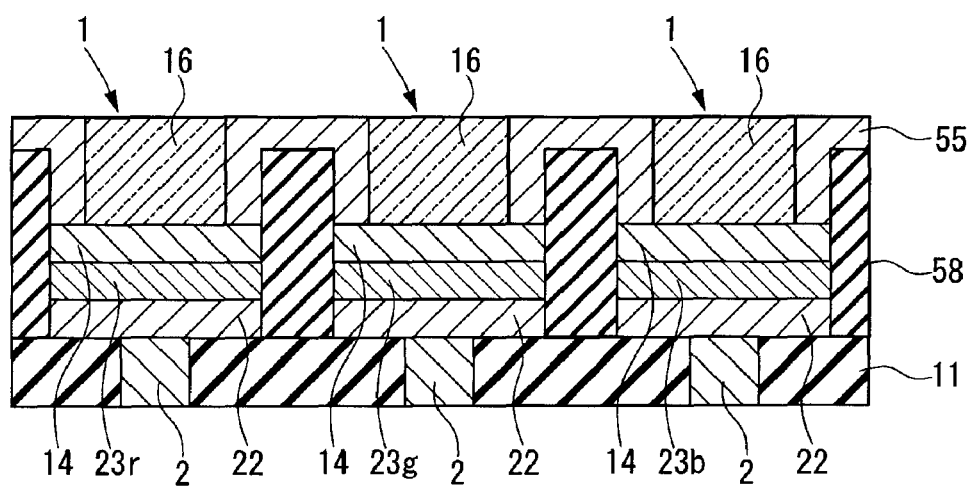
FIG. 13 is a schematic cross-section of a part of the photoelectric apparatus incorporating a fifth embodiment of the invention.

FIG. 13 is a schematic cross-section of a part of a photoelectric apparatus incorporating a fifth embodiment of the invention.

The photoelectric apparatus of the fifth embodiment has an insulating layer 58 between adjacent pixels. The upper surface of the insulating layer 58 is higher than the upper surface of the upper electrode 14 or farther from the interlayer insulating film 11 than the upper electrode 14. A partition 55 made of an electrically conductive material is formed on the peripheral portion of the upper electrode 14 (the portion in contact with the insulating layer 58) in each pixel. The partition 55 straddles the upper surface of the insulating layer 58 and contacts each of the upper electrodes of the adjacent pixels.

In the fifth embodiment, the upper electrode 14, the photoelectric layer 23r, 23g, or 23b, and the lower electrode 22 of each pixel are equal in area as seen from the light incident side and are stacked in aligned relation. Therefore, a uniform electrical field is applied to the photoelectric layer 23r, 23g, or 23b. This is effective in preventing an image lag when the photoelectric apparatus is used as an imaging apparatus, such as a digital still camera, and in eliminating a short circuit defect of the apparatus.

A method of fabricating the photoelectric apparatus of the fifth embodiment will be described. FIGS. 14 through 16 represent schematic cross-sectional views in the steps of fabrication. The structure illustrated in FIG. 13 will be occasionally referred to.

Figure 14A:
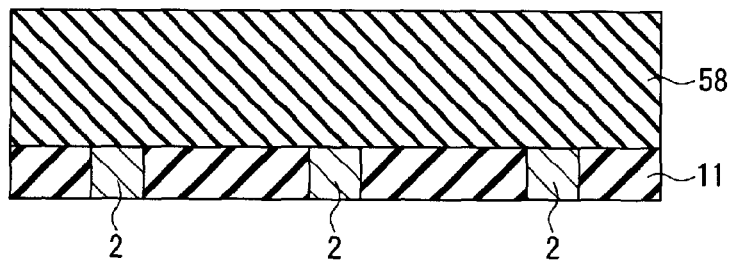
FIGS. 14A, 14B, 14C, 14D, FIG. 15A, FIG. 15B, FIG. 15C, FIG. 16A, and FIG. 16B are schematic cross-sections illustrating a method of fabricating the photoelectric apparatus of the fifth embodiment.

As illustrated in FIG. 14A, an insulating material layer is formed on the interlayer insulating layer 11 having via plugs 2 for individual pixels. The insulating material layer is to be processed to provide the insulating layer 58 defining the individual pixels.

Figure 14B:
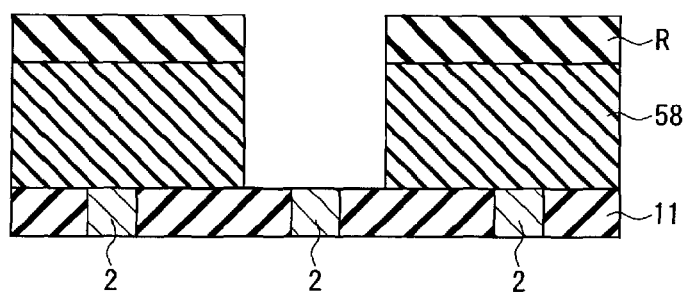

As illustrated in FIG. 14B, the insulating material layer is etched through a patterned resist film R to make a first opening through the layer in a portion where a G pixel is to be formed. The first opening corresponds to a portion where a photoelectric device of each pixel is to be fabricated.

Figure 14C:
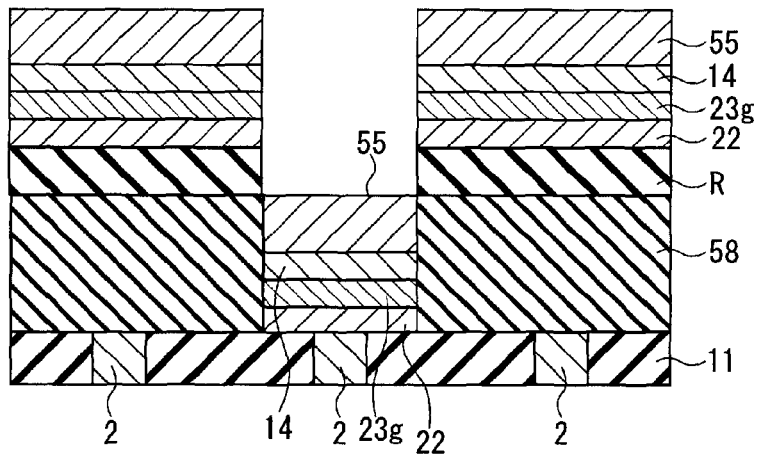

As illustrated in FIG. 14C, a lower electrode 22, a photoelectric layer 23g, an upper electrode 14, and a transparent insulating layer 16 are successively built up in the first opening. On the upper electrode 14 is then deposited a conductive material, which functions as a protective layer in fabricating other photoelectric devices 1 having pixels of other colors and is processed later to provide a partition 55.

The lower electrode 22, the photoelectric layer 23g, the upper electrode 14, and the transparent insulating layer 55 deposited on other than the G pixel portion are removed all at once by stripping off the resist film R (lift-off step). To carry out lift-off, a suitable stripper may be used to remove the resist film R, or the resist film R may be decomposed by plasma etching.

Figure 14D:
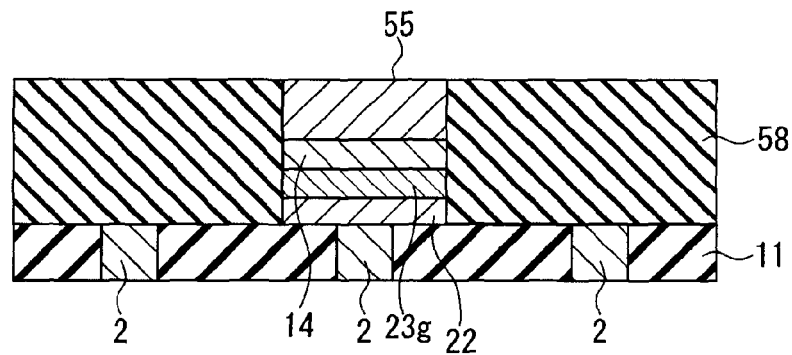
Figure 15A:
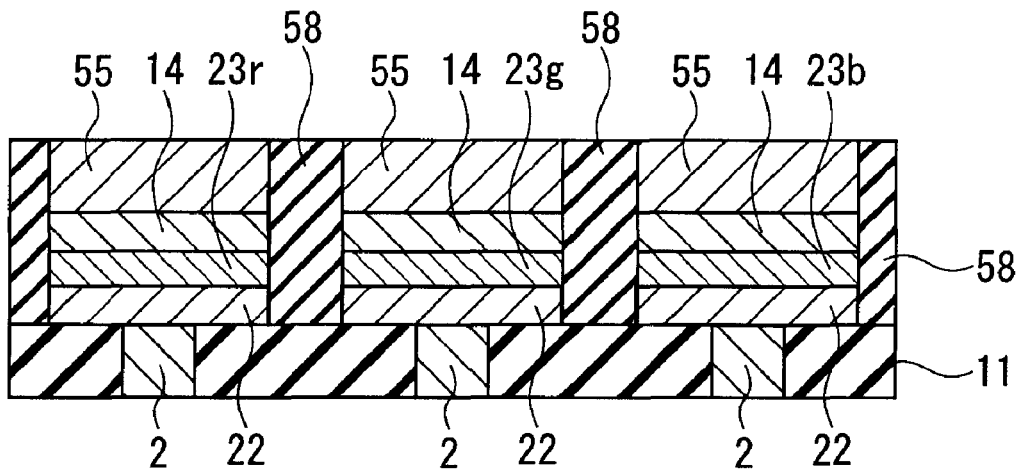

The steps shown in FIGS. 14B through 14D are repeated for R pixels and B pixels to make photoelectric devices 1 in each of which the upper electrode 14 is covered with the conductive material layer 55 as illustrated in FIG. 15A.

Figure 15B:
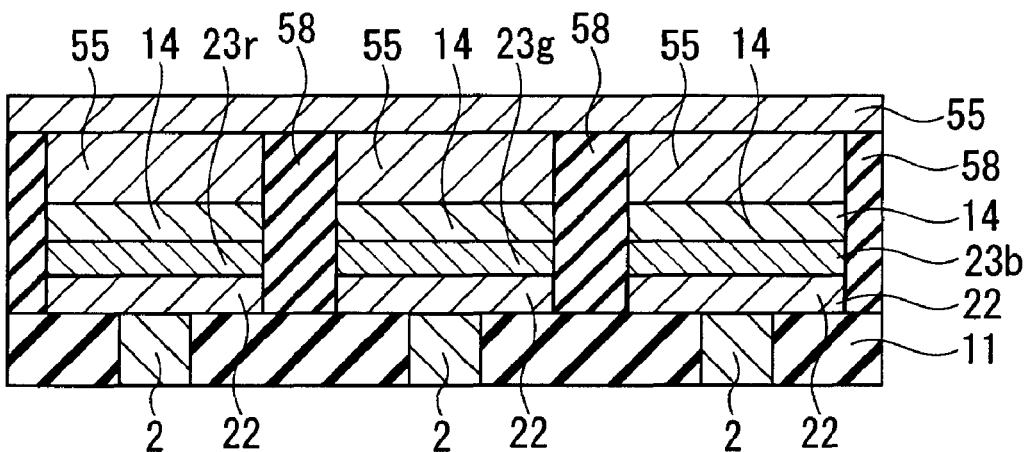

As illustrated in FIG. 15B, a conductive material layer 55 is again deposited on the conductive material layer 55 formed on the upper electrode 14 of every pixel and on the insulating layer 58.

Figure 15C:
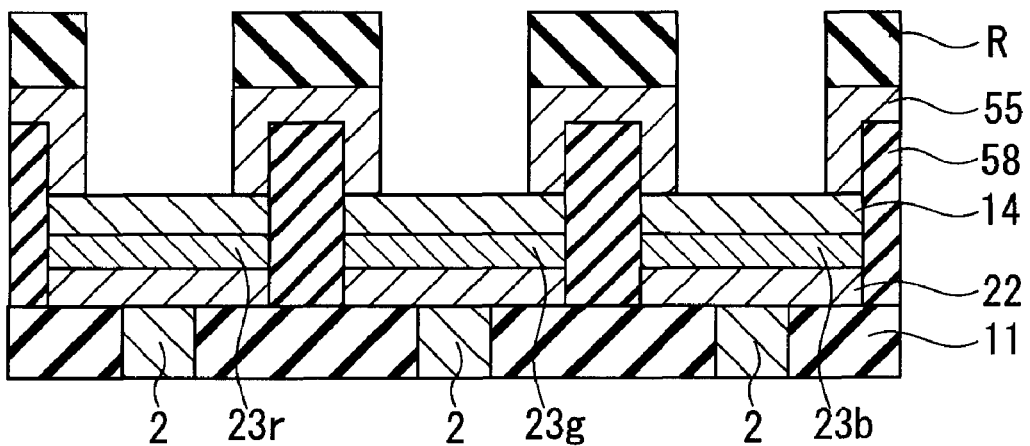

As illustrated in FIG. 15C, second openings each having a smaller area than the formerly made first openings through the conductive material layer 55 in portions corresponding to the individual pixels. The second openings are formed by patterning a resist film R formed on the conductive material layer 55 and etching the unmasked portions of the conductive material layer 55. The thus formed second openings correspond to portions where a transparent insulating layer 16 is to be deposited. In this stage, there is the resist film R left on the top surface of the partition 55.

Figure 16A:
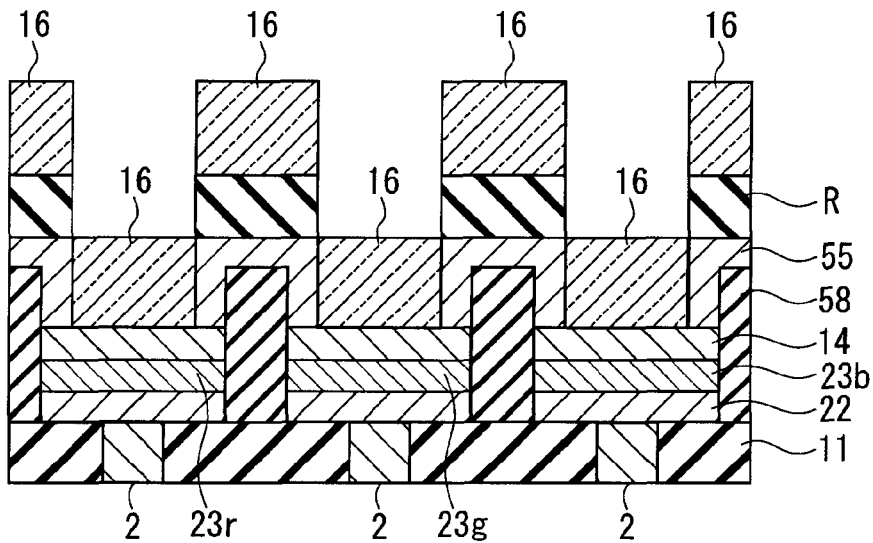
Figure 16B:
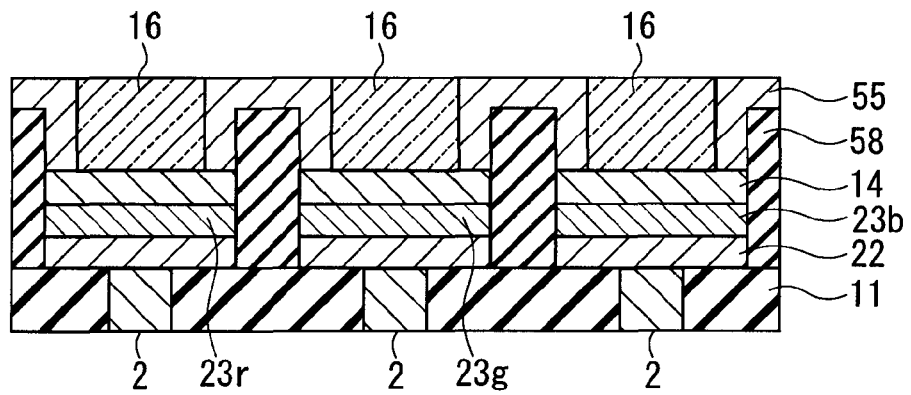

As illustrated in FIG. 16A, a transparent insulating layer 16 is deposited until the top surface level of the transparent insulating layer 16 formed inside the second openings reaches almost the same level as the top surface of the partition 55 between adjacent pixels.

After the transparent insulating film 16 is formed, the resist film R on the partition 55 is stripped off together with the transparent insulating layer 16 formed thereon (lift-off step). There is thus produced a photoelectric apparatus with the individual pixels sealed in by the partition 55 and the transparent insulating layer 16.

According to the above described method of fabricating the photoelectric apparatus of the fifth embodiment, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution. Additionally, since the formation of the lower electrode 22 in the opening does not need the step of patterning, the number of the fabrication steps is reduced.

[VI] Sixth Embodiment

Figure 17:
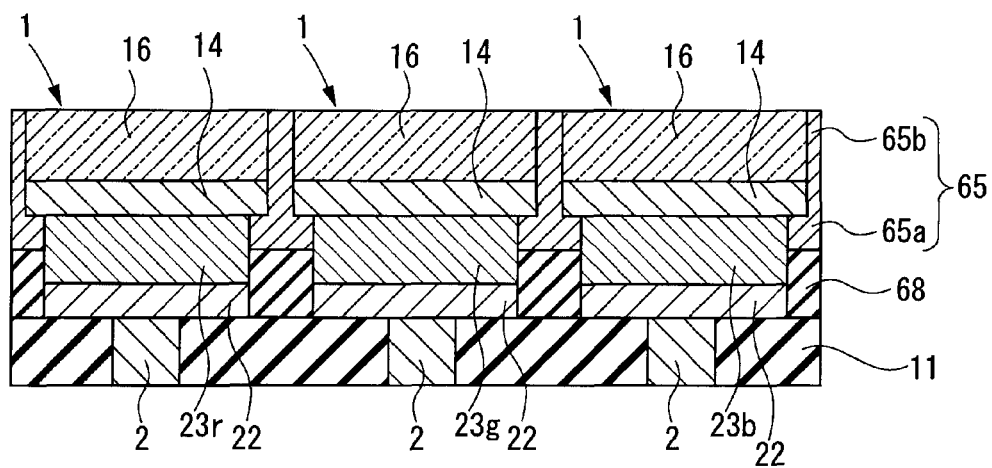
FIG. 17 is a schematic cross-section of a part of a photoelectric apparatus incorporating a sixth embodiment of the invention.

FIG. 17 is a schematic cross-section of a part of a photoelectric apparatus incorporating a sixth embodiment of the invention.

The sixth embodiment is a modification of the photoelectric apparatus shown in FIG. 6 and the photoelectric apparatus shown in FIG. 10. An insulating layer 68 of an insulating material is formed between the interlayer insulating layer 11 and the partition 65. The insulating layer 68 separates the adjacent lower electrodes 22. More specifically, the upper electrode 14 of every pixel is in contact on its side face with the partition 65 made of a conductive material, and part of the side face of the photoelectric layer 23r, 23g, or 23b and the side face of the lower electrode 22 are in contact with the insulating layer 68.

The partition 65 is composed of a lower part 65a and an upper part 65b continuous with the lower part 65a. The upper part 65b is smaller in size than the lower part 65a in the horizontal direction of FIG. 17 such that it is set back from the lower part 65a with respect to the individual pixels to provide a shoulder. The side of the lower part 65a is in contact with only the photoelectric layers 13r, 13g, or 13b. The shoulder defined by the upper and lower parts of the partition 65 is in contact with the lower side of the periphery of the upper electrode 14. The side face of the upper electrode 14 is in contact with the upper part 65b. This configuration provides an ensured electrical connection between the partition 65 and the upper electrode 14.

A transparent insulating layer 16 is formed on the upper electrode 14. The top surface of the partition 65 and that of the transparent insulating layer 16 are substantially even with each other. The upper electrode 14 (for the most part thereof), the photoelectric layer 23r, 23g, or 23b, and the lower electrode 22 of each pixel are almost equal in area as seen from the light incident side and are stacked in aligned relation. Therefore, a uniform electrical field is applied to the photoelectric layer 23r, 23g, or 23b. This is effective in preventing an image lag from occurring when the photoelectric apparatus is used as an imaging apparatus, such as a digital still camera, and in eliminating a short circuit defect of the device.

The insulating layer 68 can be formed in the same manner as described with respect to the fourth embodiment. The partition 65 can be formed in the same manner as described with respect to the second embodiment.

According to the sixth embodiment, since each pixel is sealed in by the partition 65, the insulating layer 68, and the transparent insulating layer 16, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution.

[VII] Seventh Embodiment

Figure 18:
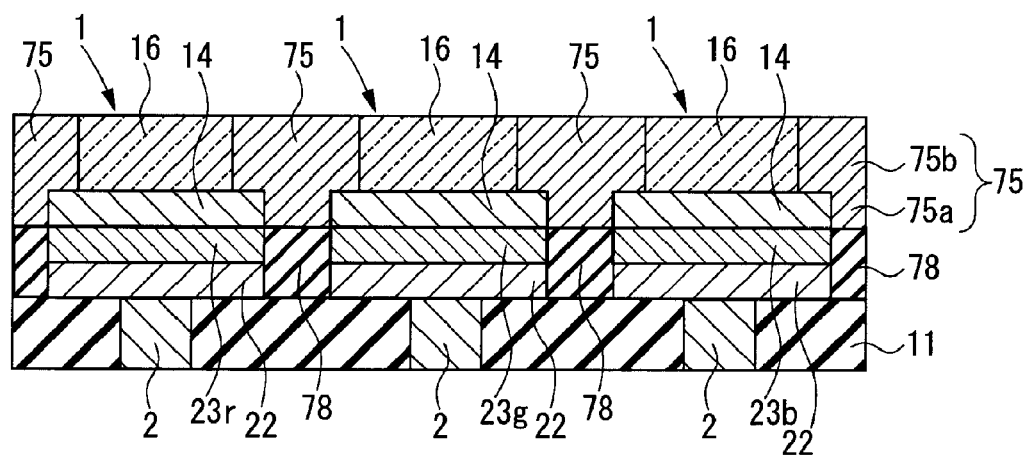
FIG. 18 is a schematic cross-section of a part of a photoelectric apparatus incorporating a seventh embodiment of the invention.

FIG. 18 is a schematic cross-section of a part of a photoelectric apparatus incorporating a seventh embodiment of the invention.

The seventh embodiment is a modification of the photoelectric apparatus shown in FIG. 7 and the photoelectric apparatus shown in FIG. 10. An insulating layer 78 made of an insulating material is formed between the interlayer insulating layer 11 and the partition 75. The insulating layer 78 separates lower electrodes 22 of adjacent pixels. More specifically, the upper electrode 14 of each pixel is in contact on its side face with partition 75 made of a conductive material, and the photoelectric layer 23r, 23g, or 23b and the lower electrode 22 of each pixel are in contact on their side faces with the insulating layer 78.

The partition 75 is composed of a lower part 75a and an upper part 75b continuous with the lower part 75a. The upper part 75b has a larger thickness than the lower part 75a in the horizontal direction of the cross-section of FIG. 18 such that it hangs over the lower part 75a toward the individual pixels to provide a downward facing shoulder. The lower part 75a is in contact with the side face of the upper electrode 14, and the downward facing shoulder defined by the upper and lower parts of the partition 75 is in contact with the upper side of the periphery of the upper electrode 14. The side face of the upper electrode 14 is in contact with the lower part 75a. This configuration provides an ensured electrical connection between the partition 75 and the upper electrode 14.

According to the configuration of the seventh embodiment, the transparent insulating layer 16 is formed on the upper electrode 14; the top surface of the partition 75 is almost even with the top surface of the transparent insulating layer 16; and the upper electrode 14, the photoelectric layer 23r, 23g, or 23b, and the lower electrode 22 of each pixel are almost equal in area as seen from the light incident side (from the upper side in FIG. 18) and are stacked in aligned relation. Therefore, a uniform electrical field is applied to the photoelectric layer 23r, 23g, or 23b. This is effective in preventing an image lag from occurring when the photoelectric apparatus is used as an imaging apparatus, such as a digital still camera, and in eliminating a short circuit defect of the device.

The insulating layer 78 can be formed in the same manner as described with respect to the fourth embodiment. The partition 75 can be formed in the same manner as described with respect to the third embodiment.

According to the seventh embodiment, since each pixel is sealed in by the partition 75, the insulating layer 78, and the transparent insulating layer 16, a photoelectric apparatus can be fabricated without causing deterioration of the RGB organic photoelectric devices during the fabrication steps utilizing semiconductor microfabrication technology, and a high resolution photoelectric apparatus can be obtained. Future advancement in semiconductor microfabrication technology will be applied as such to the pixel fabrication in expectation for further reduction of pixel pitch and improvement of resolution.

While the invention has been described with respect to its specific embodiments, it should be understood that various changes and modifications can be made therein.

For example, while the photoelectric apparatus of the invention is suited for application to an imaging apparatus, such as a digital still camera, it is also applicable to a display device, such as an organic EL display using an organic LED.

What is claimed is:

1. A photoelectric apparatus comprising a substrate and an array of a plurality of pixels each having at least one photoelectric device comprising a lower electrode over the substrate, a photoelectric layer over the lower electrode, and an upper electrode over the photoelectric layer,
the photoelectric apparatus further comprising an electrically conductive partition between adjacent two of the pixels, the conductive partition being electrically connected with the upper electrode of each of the adjacent two of the pixels, and a transparent insulating layer on the upper electrode, the pixels being individually sealed in by the partition and the transparent insulating layer
wherein the plurality of pixels comprise a red pixel having a photoelectric device that converts red light to electricity, a green pixel having a photoelectric device that coverts green light to electricity, and a blue pixel having a photoelectric device that converts blue light to electricity.

2. The photoelectric apparatus according to claim 1, wherein the upper electrode has an upper surface positioned lower than a top surface of the partition.

3. The photoelectric apparatus according to claim 2, wherein the upper electrode is transparent.

4. The photoelectric apparatus according to claim 3, wherein the partition has a shape of a grid as seen from a light incident side, and each of the pixels is isolated from every other pixels by the partition.

5. The photoelectric apparatus according to claim 3, wherein the partition comprises a lower part and an upper part continuous with the lower part, the upper part having a smaller size than the lower part such that the upper part is set back from the lower part with respect to the individual pixels, and the upper electrode is in contact with both the lower part and the upper part.

6. The photoelectric apparatus according to claim 3, wherein the partition comprises a lower part and an upper part continuous with the lower part, the upper part having a larger size than the lower part such that the upper part hangs over the lower part toward the individual pixels, and the upper electrode is in contact with both the lower part and the upper part.

7. The photoelectric apparatus according to claim 3, further comprising an insulating layer separating the lower electrodes of adjacent two of the pixels from each other, and the partition is provided on the insulating layer.

8. The photoelectric apparatus according to claim 7, wherein the upper electrode, the photoelectric layer, and the lower electrode of each of the pixels are equal in area as seen from a light incident side and are stacked in aligned relation.

9. The photoelectric apparatus according to claim 3, wherein the photoelectric device is configured to collect electrons generated in the photoelectric layer in the lower electrode, the photoelectric layer is in contact with the partition, and the partition has a larger work function than the upper electrode.

10. The photoelectric apparatus according to claim 3, wherein the photoelectric device is configured to collect holes generated in the photoelectric layer in the lower electrode, the photoelectric layer is in contact with the partition, and the partition has a smaller work function than the upper electrode.

11. The photoelectric apparatus according to claim 3, wherein the plurality of pixels comprise a first pixel having a photoelectric device that converts electromagnetic radiation of a first wavelength range to electricity and a second pixel having a photoelectric device that converts electromagnetic radiation of a second wavelength range to electricity.

12. An imaging apparatus comprising the photoelectric apparatus according to claim 3 and having a drive circuit embedded in the substrate, the drive circuit being connected to the lower electrode and configured to output a signal in response to charge.

13. The imaging apparatus according to claim 12, wherein the drive circuit is a CCD drive circuit or a CMOS drive circuit.

\* \* \* \* \*